US012812998B2

(12) United States Patent
Um et al.

(10) Patent No.: US 12,812,998 B2
(45) Date of Patent: Nov. 24, 2026

(54) IMAGE SENSOR

(71) Applicant: SAMSUNG ELECTRONICS CO., LTD., Suwon-si (KR)

(72) Inventors: Changyong Um, Seoul (KR); Jeongjin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 922 days.

(21) Appl. No.: 18/055,069

(22) Filed: Nov. 14, 2022

(65) Prior Publication Data

US 2023/0207595 A1 Jun. 29, 2023

(30) Foreign Application Priority Data

Dec. 24, 2021 (KR) ........................ 10-2021-0187811

(51) Int. Cl.
*H10F 39/00* (2025.01)
*H10F 39/18* (2025.01)

(52) U.S. Cl.
CPC ......... *H10F 39/807* (2025.01); *H10F 39/014* (2025.01); *H10F 39/182* (2025.01); *H10F 39/8053* (2025.01); *H10F 39/8063* (2025.01); *H10F 39/809* (2025.01)

(58) Field of Classification Search
CPC .. H10F 39/807; H10F 39/182; H10F 39/8063; H10F 39/8053; H10F 39/809; H10F 39/014
See application file for complete search history.

(56) References Cited

U.S. PATENT DOCUMENTS

| | | | | |
|---|---|---|---|---|
| 8,390,089 | B2 | 3/2013 | Chen et al. | |
| 9,502,450 | B2 | 11/2016 | Yanagita et al. | |
| 11,063,081 | B2 | 7/2021 | Sze et al. | |
| 11,444,108 | B2 * | 9/2022 | Mun ..................... | H10F 39/014 |
| 2015/0064832 | A1 | 3/2015 | Wan et al. | |
| 2016/0043130 | A1 | 2/2016 | Ohguro | |
| 2016/0204143 | A1 | 7/2016 | Lee et al. | |
| 2018/0190707 | A1 | 7/2018 | Lee et al. | |

(Continued)

FOREIGN PATENT DOCUMENTS

| | | |
|---|---|---|
| CN | 112885857 | 6/2021 |
| JP | 2017054890 A | 3/2017 |

(Continued)

*Primary Examiner* — Richard A Booth
(74) *Attorney, Agent, or Firm* — Morgan, Lewis & Bockius LLP

(57) ABSTRACT

An image sensor includes a semiconductor substrate including a first pixel group and a second pixel group, each of which includes at least four pixel regions, the first and second pixel groups sharing a first pixel region of the pixel regions, a pixel isolation structure disposed in the semiconductor substrate and surrounding each of the pixel regions, a first device isolation pattern provided in the second pixel group and disposed on a first portion of the pixel isolation structure, a floating diffusion region disposed adjacent to the first device isolation pattern in each of the pixel regions, a ground dopant region provided in the first pixel group and disposed on a second portion of the pixel isolation structure, and a second device isolation pattern provided in the first pixel group and disposed between the second portion of the pixel isolation structure and the ground dopant region.

20 Claims, 21 Drawing Sheets

(56) References Cited

U.S. PATENT DOCUMENTS

| | | | | |
|---|---|---|---|---|
| 2018/0301509 | A1 | 10/2018 | Ishii et al. | |
| 2020/0027910 | A1 | 1/2020 | Okura et al. | |
| 2020/0219925 | A1* | 7/2020 | Jang | H04N 25/77 |
| 2020/0279877 | A1 | 9/2020 | Kim | |
| 2020/0335536 | A1* | 10/2020 | Choi | H04N 25/76 |
| 2021/0005647 | A1 | 1/2021 | Kwag et al. | |
| 2021/0084249 | A1 | 3/2021 | Nakazawa et al. | |
| 2021/0136310 | A1 | 5/2021 | Uchida | |
| 2021/0143191 | A1 | 5/2021 | Ha et al. | |

FOREIGN PATENT DOCUMENTS

| | | | |
|---|---|---|---|
| JP | 2021-101491 | | 7/2021 |
| KR | 10-2016-0087428 | A | 7/2016 |
| KR | 10-2020-0066148 | A | 6/2020 |
| KR | 10-2021-0010442 | A | 1/2021 |
| WO | 2018186192 | A1 | 10/2018 |
| WO | 2019220945 | A1 | 11/2019 |
| WO | 2020100607 | A1 | 5/2020 |
| WO | 2020262131 | A1 | 12/2020 |
| WO | 2020262643 | | 12/2020 |

* cited by examiner

IMAGE SENSOR

CROSS-REFERENCE TO RELATED APPLICATIONS

This U.S. non-provisional patent application claims priority under 35 U.S.C. § 119 to Korean Patent Application No. 10-2021-0187811, filed on Dec. 24, 2021, in the Korean Intellectual Property Office, the entire contents of which are herein incorporated by reference.

TECHNICAL FIELD

The present inventive concept relates to an image sensor, and more particularly, to an image sensor with enhanced integration density.

DISCUSSION OF RELATED ART

An image sensor may be a device configured to convert an optical image into an electrical signal, and may have a plurality of pixels. Each of the pixels may include a photodiode region configured to receive incident light and convert the incident light into an electron-hole pair, therefore generating charges, and a pixel circuit may output a pixel signal using the charges generated in the photodiode region. With the advancement of computer and communication technologies, high-performance image sensors have been increasingly demanded in various fields such as, for example, a digital camera, a camcorder, a personal communication system (PCS), a game console, a security camera, and a medical micro camera.

Image sensors may be categorized as any one of charge coupled device (CCD) image sensors and complementary metal-oxide-semiconductor (CMOS) image sensors. The CMOS image sensor may be simply driven and may be realized as a single chip on which a signal processing circuit and an image sensing part are integrated, and thus a size of a product including the CMOS image sensor may be reduced. For example, the CMOS image sensor may be implemented with fewer components, and may provide faster readout than CCD sensors. In addition, the CMOS image sensor may have very low power consumption and thus may be easily applied to a product having a limited battery capacity. Furthermore, the CMOS image sensor may be manufactured using a CMOS process technique, thereby reducing a manufacturing cost of the CMOS image sensor. Accordingly, the CMOS image sensor may have high resolution by the development of the CMOS process technique and thus may be widely used in various fields.

SUMMARY

Embodiments of the present inventive concept may provide an image sensor with enhanced integration density.

In an embodiment of the present inventive concept, an image sensor may include a semiconductor substrate including a first pixel group and a second pixel group, each of which includes at least four pixel regions, the first and second pixel groups sharing a first pixel region of the pixel regions: a pixel isolation structure disposed in the semiconductor substrate and surrounding each of the pixel regions; a first device isolation pattern provided in the second pixel group and disposed on a first portion of the pixel isolation structure; a floating diffusion region disposed adjacent to the first device isolation pattern in each of the pixel regions; a ground dopant region provided in the first pixel group and disposed on a second portion of the pixel isolation structure; and a second device isolation pattern provided in the first pixel group and disposed between the second portion of the pixel isolation structure and the ground dopant region.

In an embodiment of the present inventive concept, an image sensor may include a semiconductor substrate having a first conductivity type and having a first surface and a second surface opposite to the first surface; a pixel isolation structure disposed in the semiconductor substrate to define first, second and third pixel regions, the pixel isolation structure including a first pixel isolation structure between the first and second pixel regions and a second pixel isolation structure between the second and third pixel regions a first device isolation pattern which is adjacent to the first surface of the semiconductor substrate and is disposed on the first pixel isolation structure; a second device isolation pattern which is spaced apart from the first surface of the semiconductor substrate and is disposed on the second pixel isolation structure; a floating diffusion region having a second conductivity type and disposed adjacent to the first device isolation pattern in each of the first, second and third pixel regions; and a ground dopant region having the first conductivity type and disposed in the semiconductor substrate on the second device isolation pattern.

In an embodiment of the present inventive concept, an image sensor may include a photoelectric conversion circuit layer including photoelectric conversion elements provided in a first semiconductor layer having a first conductivity type; a pixel circuit layer including pixel transistors provided on a second semiconductor layer and connected to the photoelectric conversion elements; and a logic circuit layer including logic circuits provided on a third semiconductor layer and connected to the pixel transistors. The pixel circuit layer may be disposed between the photoelectric conversion circuit layer and the logic circuit layer in a vertical view. The photoelectric conversion circuit layer may include a pixel isolation structure disposed in the first semiconductor layer to define first, second and third pixel regions, the pixel isolation structure including a first pixel isolation structure between the first and second pixel regions and a second pixel isolation structure between the second and third pixel regions; a first device isolation pattern which is adjacent to a first surface of the first semiconductor layer and is disposed on the first pixel isolation structure: a second device isolation pattern which is spaced apart from the first surface of the first semiconductor layer and is disposed on the second pixel isolation structure; a floating diffusion region having a second conductivity type and disposed adjacent to the first device isolation pattern in each of the first, second and third pixel regions; and a ground dopant region having the first conductivity type and disposed in the first semiconductor layer on the second device isolation pattern.

BRIEF DESCRIPTION OF THE DRAWINGS

Embodiments of the present inventive concept will be more clearly understood from the following detailed description taken in conjunction with the accompanying drawings, in which.

Figure 1:
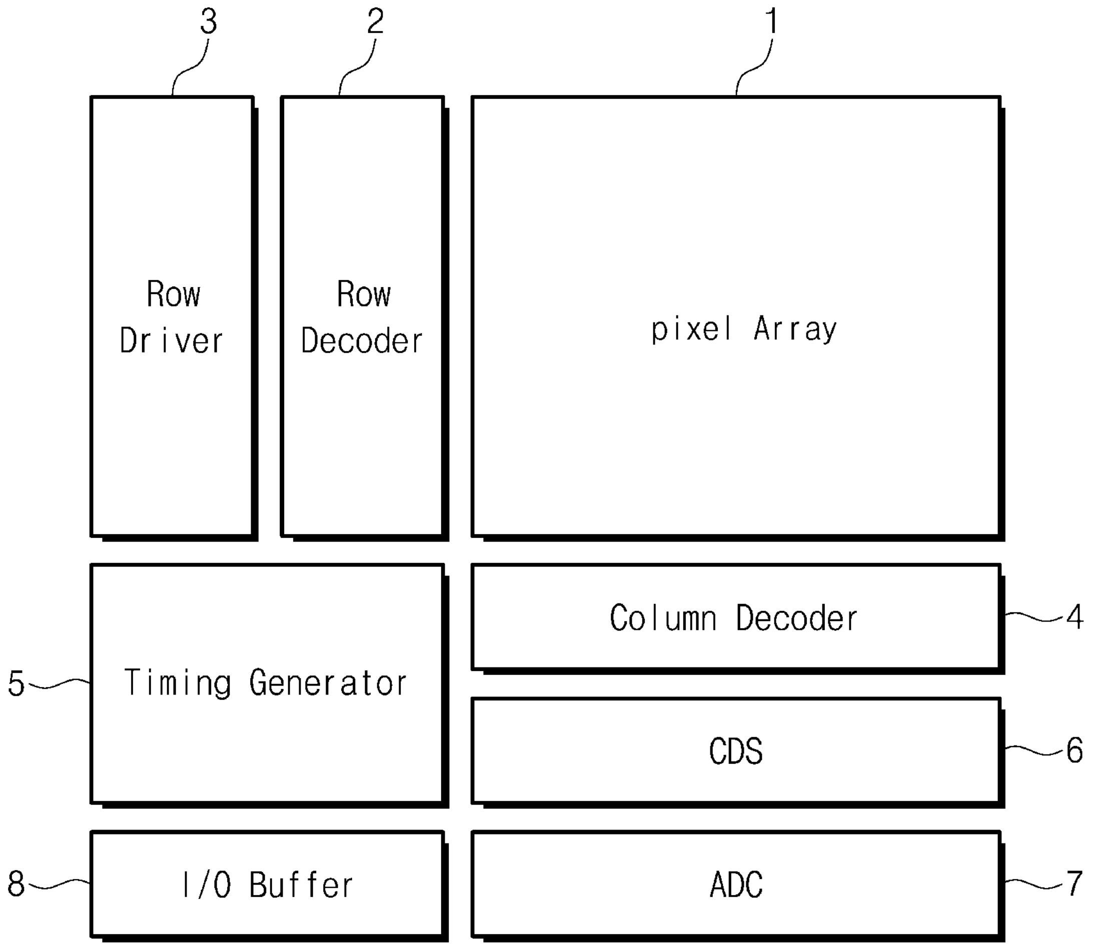
FIG. 1 is a block diagram illustrating an image sensor according to an embodiment of the present inventive concept.

Since the drawings in FIGS. 1-16 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Embodiments of the present inventive concept will now be described more fully with reference to the accompanying drawings.

FIG. 1 is a block diagram illustrating an image sensor according to an embodiment of the present inventive concept.

Referring to FIG. 1, an image sensor may include a pixel array 1, a row decoder 2, a row driver 3, a column decoder 4, a timing generator 5, a correlated double sampler (CDS) 6, an analog-to-digital converter (ADC) 7, and an input/output buffer (I/O buffer) 8.

The pixel array 1 may include a plurality of unit pixels arranged along rows and columns and may convert light incident to the unit pixels into electrical signals. The pixel array 1 may be driven by a plurality of driving signals (e.g., a selection signal, a reset signal, and a transfer signal) provided from the row decoder 2.

The row decoder 2 may provide the driving signals to the unit pixels of each row. The unit pixels included in the pixel array 1 may provide one output voltage at a time in units of rows. Thus, the unit pixels in one row of the pixel array 1 may be simultaneously activated in response to a selection signal output by the row driver 3. In addition, electrical signals converted in the pixel array 1 may be provided to the correlated double sampler 6 in response to the driving signals.

The row driver 3 may provide the plurality of driving signals for driving the plurality of unit pixels to the pixel array 1, depending on results decoded in the row decoder 2. In the event that the unit pixels are arranged in a matrix form, the driving signals may be provided in the unit of row. Instead of matrix form, the unit pixels may be arranged in a pentile matrix shape, or a diamond shape.

The timing generator 5 may control the row and column decoders 2 and 4, the correlated double sampler 6, the analog-to-digital converter 7, and the I/O buffer 8 and may supply control signals (e.g., a clock signal, a timing control signal, etc.) in operation thereof. The timing generator 5 may include a logic control circuit, a phase lock loop (PLL) circuit, a timing control circuit, and a communication interface circuit.

The correlated double sampler (CDS) 6 may receive electrical signals converted from optical signals (absorbed light) by the unit pixels included in the pixel array 1 and may hold and sample the received electrical signals provided by the pixel array 1. The correlated double sampler 6 may doubly sample a specific noise level and a signal level of the electrical signal and may output a difference level corresponding to a difference between the noise level and the signal level.

The analog-to-digital converter (ADC) 7 may convert an analog signal, which corresponds to the difference level outputted from the correlated double sampler 6, into a digital signal and may output the digital signal.

The I/O buffer 8 may latch the digital signals outputted from the analog-to-digital converter 7, and the latched signals may be sequentially outputted to an image signal processing unit, depending on results decoded in the column decoder 4.

Figure 2A:
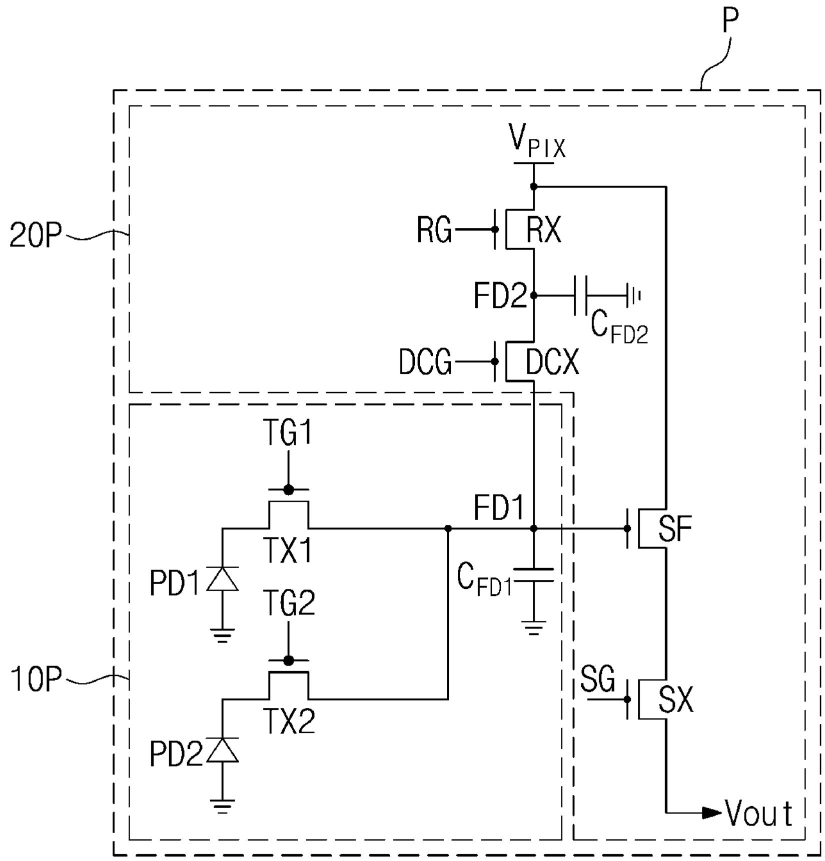
FIGS. 2A, 2B and 2C are circuit diagrams illustrating unit pixels of pixel arrays each according to an embodiment of the present inventive concept.
Figure 2B:
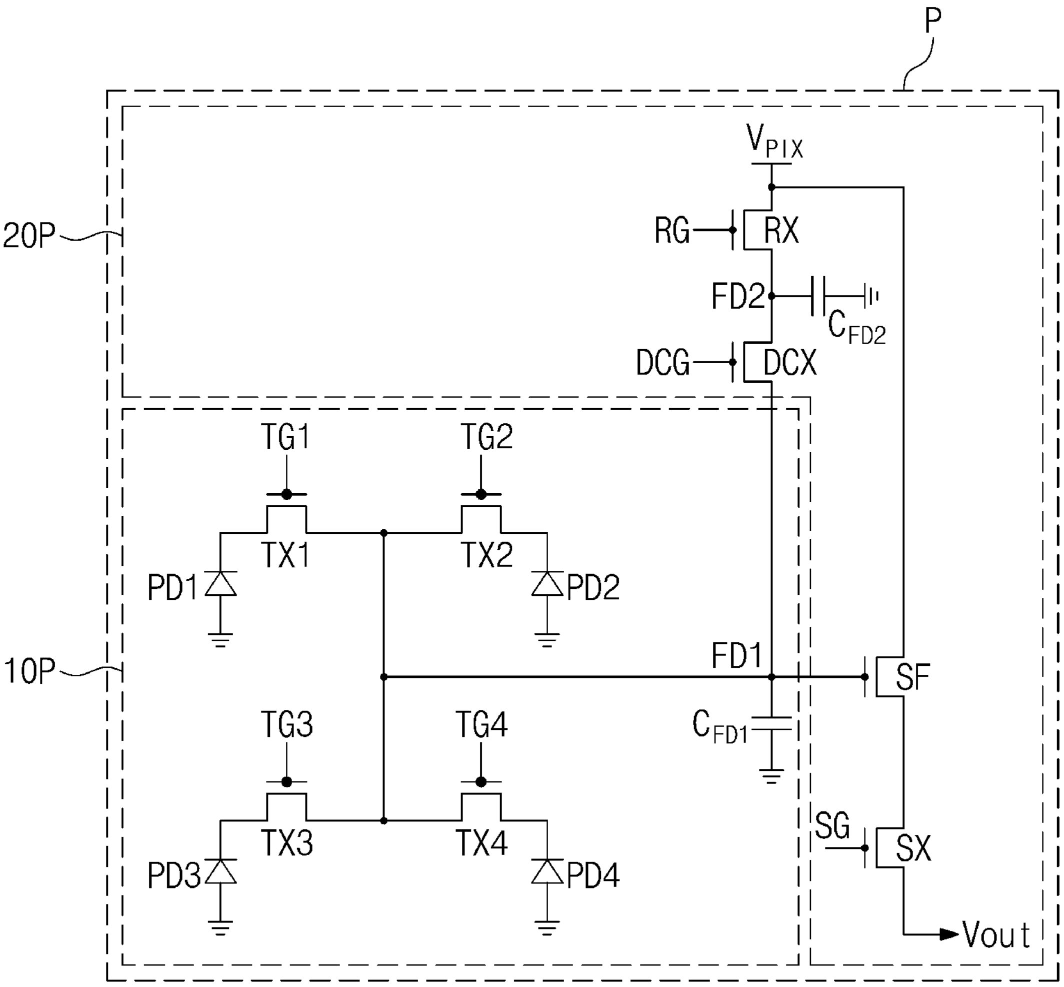
Figure 2C:
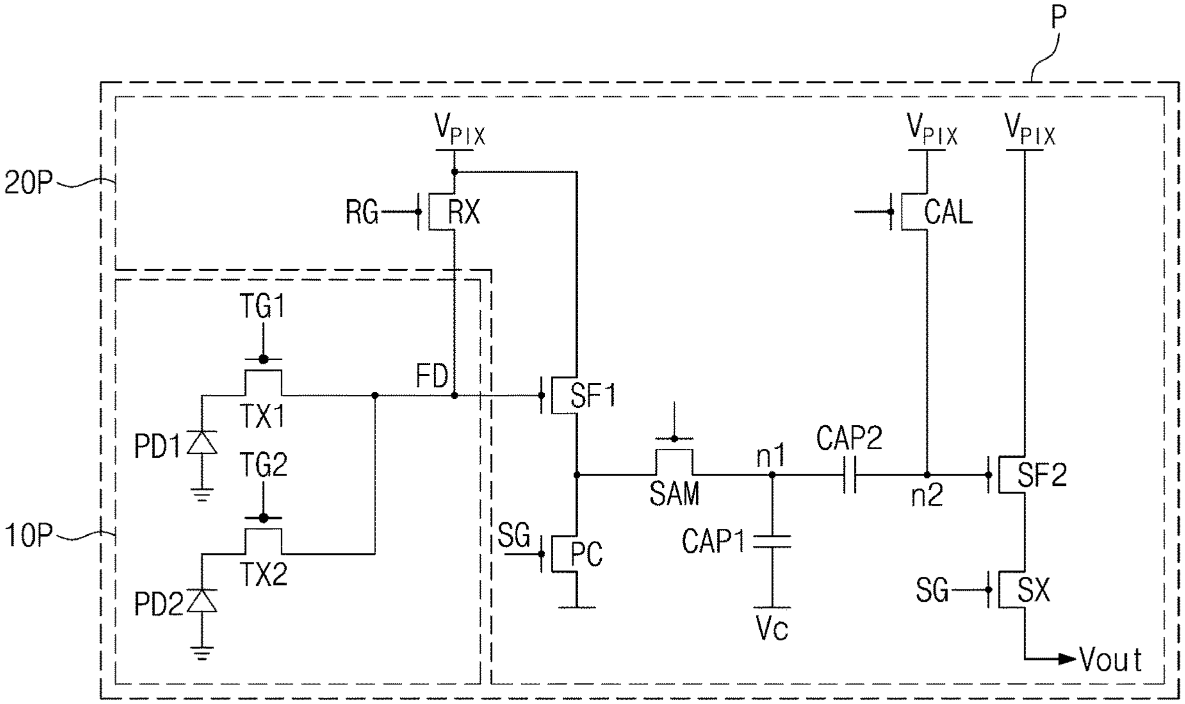

FIGS. 2A, 2B and 2C are circuit diagrams illustrating unit pixels of pixel arrays each according to an embodiment of the present inventive concept.

Referring to FIG. 2A, a unit pixel P may include a photoelectric conversion circuit 10P and a pixel circuit 20P.

The photoelectric conversion circuit 10P may include a plurality of photoelectric conversion elements PD1 and PD2, a plurality of transfer transistors TX1 and TX2, and a floating diffusion region FD1. For example, the photoelectric conversion circuit 10P may include first and second photoelectric conversion elements PD1 and PD2, first and second transfer transistors TX1 and TX2, and a first floating diffusion region FD1 connected in common to the first and second transfer transistors TX1 and TX2.

The pixel circuit 20P may include a reset transistor RX, a source follower transistor SF, and a selection transistor SX. The pixel circuit 20P may further include a dual conversion gain transistor DCX, and a second floating diffusion region FD2.

Each of the unit pixels P includes four pixel transistors RX, DCX, SF and SX in the present embodiment, but the present inventive concept is not limited thereto. For example, the number of the pixel transistors in each of the unit pixels P may be changed to tree or less, or five or more.

The first and second photoelectric conversion elements PD1 and PD2 may generate and accumulate charges corresponding to incident light. For example, each of the first and second photoelectric conversion elements PD1 and PD2 may include, for example, a photodiode, a photo transistor, a photo gate, a pinned photodiode (PPD), or a combination thereof.

The first and second transfer transistors TX1 and TX2 may transfer charges accumulated in the first and second photoelectric conversion elements PD1 and PD2 into the first floating diffusion region FD1. The first and second transfer transistors TX1 and TX2 may be controlled by first and second transfer signals TG1 and TG2. The first and second transfer transistors TX1 and TX2 may share the first floating diffusion region FD1.

The first floating diffusion region FD1 may receive and cumulatively store charges generated in the first or second photoelectric conversion element PD1 or PD2. The gate electrode of the first source follower transistor SF1 may be connected to the first floating diffusion region FD1. The source follower transistor SF may be controlled depending on the amount of photocharges accumulated in the first floating diffusion region FD1.

The reset transistor RX may periodically reset charges accumulated in the first floating diffusion region FD1 and the second floating diffusion region FD2 by a reset signal RG applied to a reset gate electrode. In detail, a drain terminal of the reset transistor RX may be connected to the dual conversion gain transistor DCX, and a source terminal of the reset transistor RX may be connected to a pixel power voltage $V_{PIX}$. When the reset transistor RX and the dual conversion gain transistor DCX are turned-on, the pixel power voltage $V_{PIX}$ may be transmitted to the first and second floating diffusion regions FD1 and FD2. Thus, the charges accumulated in the first and second floating diffusion regions FD1 and FD2 may be discharged to reset the first and second floating diffusion regions FD1 and FD2. The first and second floating diffusion regions FD1 and FD2 may be regions which convert charges into voltages or electrical signals, and charges may be accumulatively stored in the first and second floating diffusion regions FD1 and FD2.

The dual conversion gain transistor DCX may be connected between the first floating diffusion region FD1 and the second floating diffusion region FD2. The dual conversion gain transistor DCX may be connected in series to the reset transistor RX through the second floating diffusion region FD2. In other words, the dual conversion gain transistor DCX may be connected between the first floating diffusion region FD1 and the reset transistor RX. Alternatively, the reset transistor RX may be connected between the second floating diffusion region FD2 and the dual conversion gain transistor DCX. The dual conversion gain transistor DCX may change a first capacitance $C_{FD1}$ of the first floating diffusion region FD1 in response to a dual conversion gain control signal DCG, and thus a conversion gain of the unit pixel P may be changed.

When an image is obtained, strong light and weak light may be incident to the pixel array at the same time. Thus, the conversion gain of each of the unit pixels P may be changed depending on the intensity of incident light. By operation of the dual conversion gain transistor DCX, different conversion gains may be provided in a first conversion gain mode (or a high illumination mode) and a second conversion gain mode (or a low illumination mode).

When the dual conversion gain transistor DCX is turned-off, a capacitance of the first floating diffusion region FD1 may correspond to the first capacitance $C_{FD1}$. In other words, when the dual conversion gain transistor DCX is turned-off, the unit pixel P may have a first conversion gain.

When the dual conversion gain transistor DCX is turned-on, the first floating diffusion region FD1 may be connected to the second floating diffusion region FD2, and thus a capacitance in the first and second floating diffusion regions FD1 and FD2 may be a sum ($C_{FD1}$+$C_{FD2}$) of first and second capacitances $C_{FD1}$ and $C_{FD2}$. In other words, when the dual conversion gain transistor DCX is turned-on, the unit pixel P may have a second conversion gain smaller than the first conversion gain.

When the dual conversion gain transistor DCX is turned-on, the capacitance of the first or second floating diffusion region FD1 or FD2 may be increased to reduce the conversion gain, and when the dual conversion gain transistor DCX is turned-off, the capacitance of the first floating diffusion region FD1 may be reduced to increase the conversion gain.

The source follower transistor SF may be a source follower buffer amplifier of generating a source-drain current in proportion to the amount of charges of the first floating diffusion region FD1 inputted into a source follower gate electrode. The source follower transistor SF may amplify a change in electric potential of the first floating diffusion region FD1 and may output the amplified signal to an output line Vout through the selection transistor SX. A source terminal of the source follower transistor SF may be connected to the pixel power voltage $V_{PIX}$, and a drain terminal of the source follower transistor SF may be connected to a source terminal of the selection transistor SX.

The selection transistor SX may select the unit pixels P to be read in the unit of row. When the selection transistor SX is turned-on by a selection signal SG applied to a selection gate electrode, an electrical signal outputted at the drain terminal of the source follower transistor SF may be outputted to the output line Vout.

Referring to FIG. 2B, a unit pixel P may include a photoelectric conversion circuit 10P and a pixel circuit 20P as described with reference to FIG. 2A, and the photoelectric conversion circuit 10P may include first, second, third and fourth photoelectric conversion elements PD1, PD2, PD3 and PD4, first, second, third and fourth transfer transistors TX1, TX2, TX3 and TX4, and a first floating diffusion region FD1. Like the embodiments of FIG. 2A, the pixel circuit 20P may include four pixel transistors RX, DCX, SF and SX and a second floating diffusion region FD2.

The first to fourth transfer transistors TX1, TX2, TX3 and TX4 may share the first floating diffusion region FD1. The first to fourth transfer transistors TX1, TX2, TX3 and TX4 may transfer charges accumulated in the first, second, third and fourth photoelectric conversion elements PD1, PD2, PD3 and PD4 into the first floating diffusion region FD1. Transfer gate electrodes of the first to fourth transfer transistors TX1, TX2, TX3 and TX4 may be controlled by first to fourth transfer signals TG1, TG2, TG3 and TG4.

As described with reference to FIG. 2A, the pixel circuit 20P may include the reset transistor RX, the source follower transistor SF, the selection transistor SX, the dual conversion gain transistor DCX, and the second floating diffusion region FD2.

According to the embodiment illustrated in FIG. 2C, a unit pixel P may have an in-pixel correlated double sampling (CDS) structure. In addition, the unit pixel P may include a photoelectric conversion circuit 10P and a pixel circuit 20P, as described with reference to FIG. 2A.

The photoelectric conversion circuit 10P may include first and second photoelectric conversion elements PD1 and PD2, first and second transfer transistors TX1 and TX2, and a floating diffusion region FD connected in common to the first and second transfer transistors TX1 and TX2, as described with reference to FIG. 2A. Alternatively, the photoelectric conversion circuit 10P may include four photoelectric conversion elements and four transfer transistors, as described with reference to FIG. 2B.

The pixel circuit 20P may include a reset transistor RX, a first source follower transistor SF1, a precharge transistor PC, a sampling transistor SAM, a calibration transistor CAL, a second source follower transistor SF2, a selection transistor SX, a first capacitor CAP1, and a second capacitor CAP2.

The reset transistor RX may be controlled by a reset signal RG inputted to its gate electrode. A drain of the reset transistor RX may be connected to the floating diffusion region FD, and a source of the reset transistor RX may be connected to a power voltage $V_{PIX}$. When the reset transistor RX is turned-on by the reset signal RG, the power voltage $V_{PIX}$ connected to the source of the reset transistor RX may be transmitted to the floating diffusion region FD. In other words, when the reset transistor RX is turned-on, photocharges accumulated in the floating diffusion region FD may be discharged to reset the floating diffusion region FD.

The first source follower transistor SF1 may be a source follower buffer amplifier for generating a source-drain current in proportion to the amount of photocharges inputted to its gate electrode. A drain of the first source follower transistor SF1 may be connected to the power voltage $V_{PIX}$, and a source of the first source follower transistor SF1 may be connected to a source of the precharge transistor PC and a source of the sampling transistor SAM.

The sampling transistor SAM may be connected between the source of the first source follower transistor SF1 and a first node n1. First electrodes of the first and second capacitors CAP1 and CAP2 may be connected to the first node n1. A capacitor voltage Vc may be applied to a second electrode of the first capacitor CAP1, and a second electrode of the second capacitor CAP2 may be connected to a second node n2.

The precharge transistor PC may precharge the first capacitor CAP1 and the second capacitor CAP2 to allow the first source follower transistor SF1 to sample a new voltage.

A drain of the calibration transistor CAL may be connected to the power voltage $V_{PIX}$, and a source of the calibration transistor CAL may be connected to the second node n2. The second node n2 may be calibrated by the calibration transistor CAL. For example, the second capacitor CAP2 may be between the calibration transistor CAL and the first capacitor CAP1, and by increasing the capacitance of the second capacitor CAP2, the noise generated when calibration transistor CAL is turned off may be reduced.

A gate electrode of the second source follower transistor SF2 may be connected to the second node n2. A drain of the second source follower transistor SF2 may be connected to the power voltage $V_{PIX}$, and a source of the second source follower transistor SF2 may be connected to a drain of the selection transistor SX. The second source follower transistor SF2 may amplify a change in electric potential of the second node n2 and may output a pixel signal to an output line Vout through the selection transistor SX.

Figure 3A:
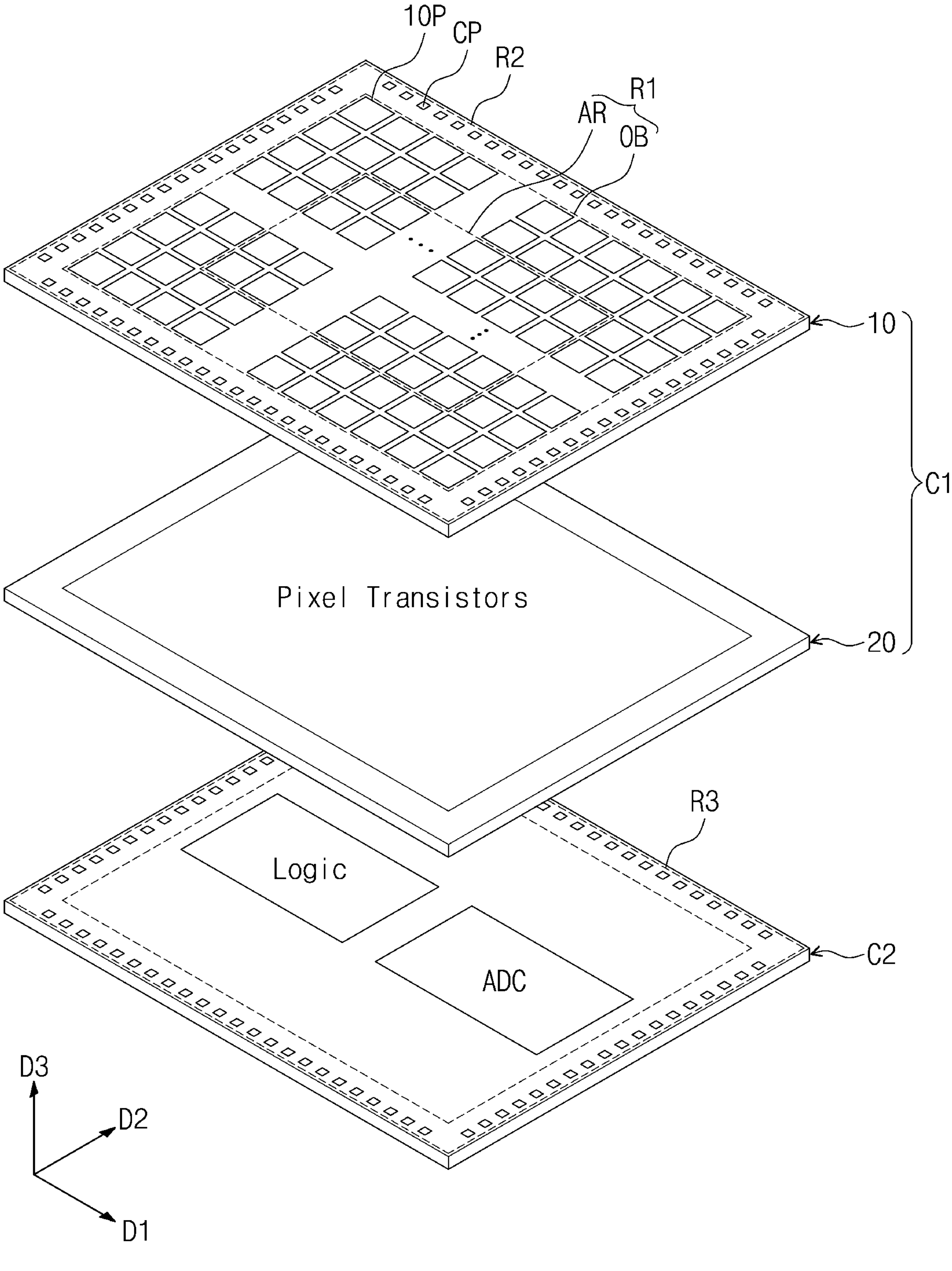
FIGS. 3A and 3B are schematic perspective views illustrating image sensors each according to an embodiment of the present inventive concept.
Figure 3B:
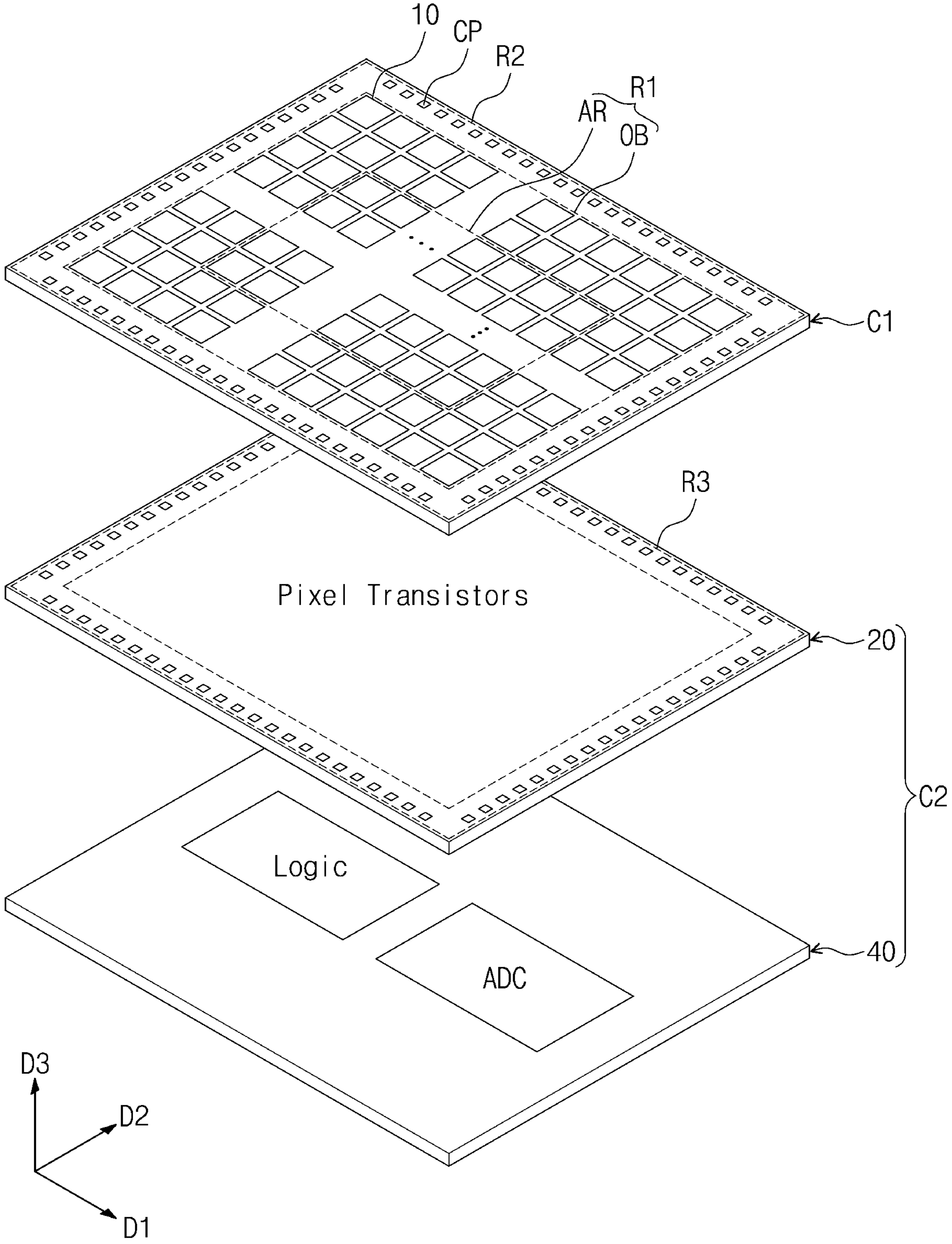

FIGS. 3A and 3B are schematic perspective views illustrating image sensors each according to an embodiment of the present inventive concept.

Referring to FIG. 3A, an image sensor may include a sensor chip C1 and a logic chip C2.

The sensor chip C1 may convert an image from an external object into electrical signals or data signals. The sensor chip C1 may include the pixel array (see 1 of FIG. 1) described above with reference to FIG. 1. In other words, the sensor chip C1 may include a plurality of unit pixels P, and each of the unit pixels P may include the photoelectric conversion circuit 10P and the pixel circuit 20P, as described above with reference to FIGS. 2A, 2B and 2C.

The sensor chip C1 may include a pixel array region R1 and a pad region R2. The pixel array region R1 may include the plurality of unit pixels two-dimensionally arranged in a first direction D1 and a second direction D2 which intersect each other. An electrical signal generated by incident light may be outputted from each of the unit pixels of the pixel array region R1.

The pixel array region R1 may include a light-receiving region AR and alight-blocking region OB. The light-blocking region OB may surround the light-receiving region AR when viewed in a plan view. In other words, the light-blocking region OB may be disposed at top, bottom, left and right sides of the light-receiving region AR when viewed in a plan view. Reference pixels to which light is not incident may be provided in the light-blocking region OB, and magnitudes of electrical signals sensed from the unit pixels may be calculated by comparing the amount of reference charges generated from the reference pixels in the light-blocking region OB with the amount of charges sensed from the unit pixels of the light-receiving region AR.

A plurality of conductive pads CP used to input/output control signals and photoelectric signals may be disposed in the pad region R2. The pad region R2 may surround the pixel array region R1 in a plan view to realize electrical connection with an external device. The conductive pads CP may be used to input/output electrical signals generated from the unit pixels to the external device.

The sensor chip C1 may include a photoelectric conversion circuit layer 10, a pixel circuit layer 20, and a light-transmitting layer. In a vertical view, the pixel circuit layer 20 may be disposed between the photoelectric conversion circuit layer 10 and the light-transmitting layer. In addition, the pixel circuit layer 20 may be adjacent to the logic chip C2.

The photoelectric conversion circuit layer 10 may include the photoelectric conversion circuits 10P of the plurality of unit pixels P, described above with reference to FIGS. 2A, 2B and 2C. The photoelectric conversion circuits 10P may be two-dimensionally arranged in the first and second directions D1 and D2 intersecting each other.

The pixel circuit layer 20 may include the pixel circuits 20P of the plurality of unit pixels P, described above with reference to FIGS. 2A, 2B and 2C. The pixel circuits 20P may be provided to correspond to the photoelectric conversion circuits 10P, respectively.

The logic chip C2 may include logic circuits (see 2, 3, 4, 5, 6, 7 and 8 of FIG. 1), a power circuit, an input/output interface, and/or an image signal processor. In other words, the logic chip C2 may include other components except the pixel array 1 in the image sensor of FIG. 1.

The logic chip C2 may include a logic pad region R3 corresponding to the pad region R2 of the sensor chip C1. A plurality of conductive pads used to input/output control signals may be disposed in the logic pad region R3. The conductive pads CP of the sensor chip C1 may be electrically connected to the conductive pads of the logic chip C2. For example, the conductive pads CP of the sensor chip C1 may be electrically connected to the conductive pads of the logic chip C2 by a second through-conductive pattern 525 to be described. The logic chip C2 may be bonded to the sensor chip C1 so as to be adjacent to the pixel circuit layer 20 of the sensor chip C1.

Referring to FIG. 3B, an image sensor may include a sensor chip C1 and a logic chip C2, and the sensor chip C1 may be a photoelectric conversion circuit layer 10 including the photoelectric conversion circuits 10P of the plurality of unit pixels P, described above with reference to FIGS. 2A, 2B and 2C.

The logic chip C2 may include a pixel circuit layer 20 including the pixel circuits 20P of the plurality of unit pixels and a logic circuit layer 40 including logic circuits (see 2, 3, 4, 5, 6, 7 and 8 of FIG. 1). The pixel circuit layer 20 of the logic chip C2 may include a logic pad region R3 corresponding to the pad region R2 of the sensor chip C1. The conductive pads CP of the sensor chip C1 may be electrically connected to conductive pads of the logic chip C2. Alternatively, instead of the logic chip C2 including the pixel circuit layer 20 and logic circuit layer 40, the logic chip C2 may include only one layer with logic circuits located in the central region and pixel circuits located in the peripheral region or vice versa.

Figure 4:
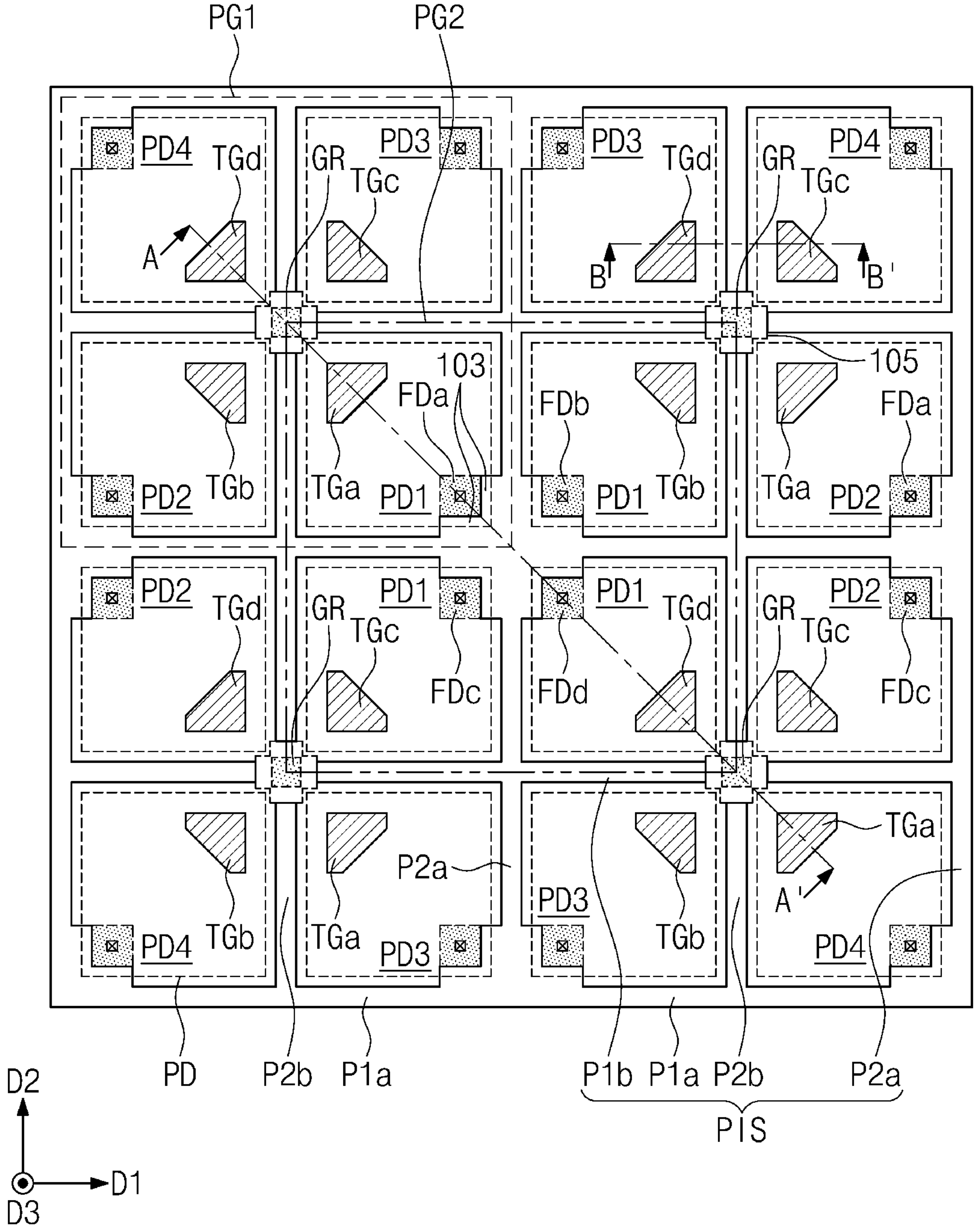
FIG. 4 is a plan view illustrating an image sensor according to an embodiment of the present inventive concept.
Figure 5A:
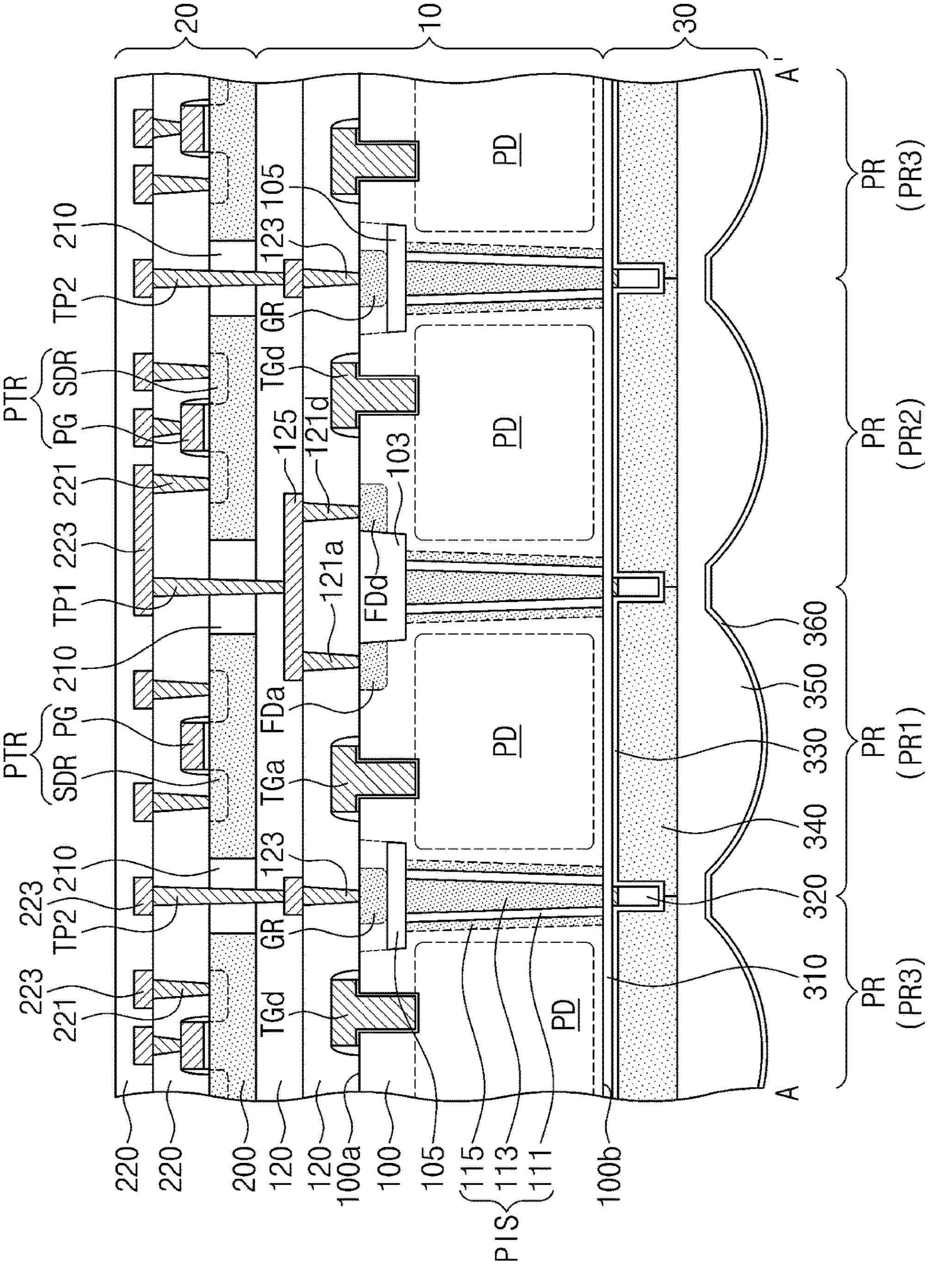
FIGS. 5A and 5B are cross-sectional views taken along lines A-A' and B-B' of FIG. 4, respectively, to illustrate an image sensor according to an embodiment of the present inventive concept.
Figure 5B:
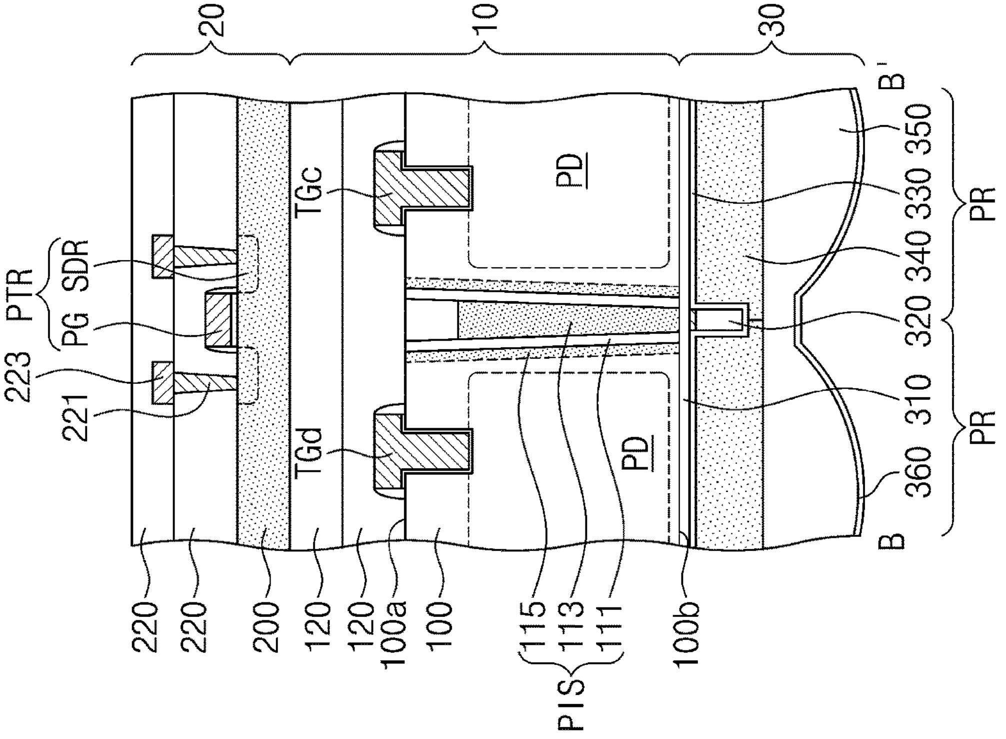

FIG. 4 is a plan view illustrating an image sensor according to an embodiment of the present inventive concept, and FIGS. 5A and 5B are cross-sectional views taken along lines A-A' and B-B' of FIG. 4, respectively, to illustrate an image sensor according to an embodiment of the present inventive concept.

Referring to FIGS. 4, 5A and 5B, an image sensor according to an embodiment of the present inventive concept may include a photoelectric conversion circuit layer 10, a pixel circuit layer 20, and a light-transmitting layer 30.

The photoelectric conversion circuit layer 10 may be disposed between the pixel circuit layer 20 and the light-transmitting layer 30 in a vertical view. The photoelectric conversion circuit layer 10 may include a semiconductor substrate (or a first semiconductor layer) 100, a pixel isolation structure PIS, a photoelectric conversion region PD (e.g., PD1, PD2, PD3, or PD4), a transfer gate electrode TG (e.g., TGa, TGb, TGc, or TGd), a floating diffusion region FD (e.g., FDa, FDb, FDc or FDd), a ground dopant region GR, and first interlayer insulating layers 120.

The semiconductor substrate 100 may have a first surface (or a front surface) 100*a* and a second surface (or a back surface) 100*b*, which are opposite to each other. The semiconductor substrate 100 may be a substrate in which an epitaxial layer having a first conductivity type (e.g., a p-type) is formed on a bulk silicon (Si) substrate having the first conductivity type and may be a substrate in which the p-type epitaxial layer remains by removing the bulk silicon (Si) substrate in a process of manufacturing an image sensor. Alternatively, the semiconductor substrate 100 may be a bulk semiconductor substrate including a well having the first conductivity type. However, the present inventive concept is not limited thereto. In an embodiment of the present inventive concept, the semiconductor substrate 100 may include a p-type bulk silicon (Si) substrate and an n-type epitaxial layer grown on the p-type bulk silicon (Si) substrate. In an example embodiment of the present inventive concept, the semiconductor substrate 100 may include an n-type bulk silicon (Si) substrate and a p-type or n-type epitaxial layer grown thereon.

The semiconductor substrate 100 may include a first pixel group PG1 and a second pixel group PG2. Each of the first and second pixel groups PG1 and PG2 may include at least four pixel regions PR. The pixel regions PR may be arranged in a matrix form in the first direction D1 and the second direction D2, and the first and second pixel groups PG1 and PG2 may share one of the pixel regions PR. Each of the pixel regions PR may be defined by the pixel isolation structure PIS.

The pixel isolation structure PIS may be disposed in the semiconductor substrate 100. The pixel isolation structure PIS may include first and second isolation portions P1*a* and P1*b* which are parallel to the first direction D1 and are spaced apart from each other in the second direction D2, and third and fourth isolation portions P2*a* and P2*b* which are parallel to the second direction D2 and are spaced apart from each other in the first direction D1. The first and second isolation portions P1*a* and P1*b* may be alternately arranged in the second direction D2, and the third and fourth isolation portions P2*a* and P2*b* may be alternately arranged in the first direction D1. Here, the third and fourth isolation portions P2*a* and P2*b* may intersect the first and second isolation portions P1*a* and P1*b*. Each of the pixel regions PR may be surrounded by the first to fourth portions P1*a*, P1*b*, P2*a* and P2*b* of the pixel isolation structure PIS. In other words, the pixel isolation structure PIS may be disposed in the semiconductor substrate 100 and may surround each of the pixel regions PR.

For example, the pixel regions PR may include first, second and third pixel regions PR1, PR2 and PR3, and the pixel isolation structure PIS may include a first pixel isolation structure between the first and second pixel regions PR1 and PR2, and a second pixel isolation structure between the second and third pixel regions PR2 and PR3.

The pixel isolation structure PIS may include a first intersecting portion at which the first isolation portion P1*a* and the third isolation portion P2*a* are connected to each other, and a second intersecting portion at which the second isolation portion P1*b* and the fourth isolation portion P2*b* are connected to each other. Vertical lengths of the first and second intersecting portions of the pixel isolation structure PIS may be smaller than vertical lengths of the first to fourth isolation portions P1*a*, P1*b*, P2*a* and P2*b* not in the first and second intersecting portions of the pixel isolation structure PIS. The "first and second intersecting portions" of the pixel isolation structure PIS may also be referred to as the "first and second portions" of the pixel isolation structure PIS.

In an embodiment of the present inventive concept, a first device isolation pattern 103 may be disposed on the first intersecting portion of the pixel isolation structure PIS. A second device isolation pattern 105 may be disposed on the second intersecting portion of the pixel isolation structure PIS. Here, the second intersecting portion of the pixel isolation structure PIS may be located away from the first intersecting portion in a diagonal direction. In the first and second intersecting portions of the pixel isolation structure PIS, top portions of the first to fourth isolation portions P1*a*, P1*b*, P2*a* and P2*b* may be removed to form the first device isolation pattern 103 and the second device isolation pattern 105, and thus, the vertical lengths of the first to fourth isolation portions P1*a*, P1*b*, P2*a* and P2*b* may be reduced to smaller vertical lengths in the first and second intersecting portions of the pixel isolation structure PIS.

The pixel isolation structure PIS may completely or partially penetrate the semiconductor substrate 100. The pixel isolation structure PIS may extend from the first surface 100*a* toward the second surface 100*b*. The pixel isolation structure PIS may have an upper width at the first surface 100*a* of the semiconductor substrate 100 and may have a lower width at its bottom surface. Here, the lower width may be substantially equal to or smaller than the upper width. A width of the pixel isolation structure PIS may become progressively smaller from the first surface 100*a* toward the second surface 100*b* of the semiconductor substrate 100. However, the present inventive concept is not limited thereto. For example, on the contrary, the width of the pixel isolation structure PIS may become progressively greater from the first surface 100*a* toward the second surface 100*b* of the semiconductor substrate 100.

The pixel isolation structure PIS may include a liner insulating pattern 111, a semiconductor pattern 113, and a barrier dopant region 115.

The semiconductor pattern 113 may vertically penetrate a portion of the semiconductor substrate 100, and may include an undoped poly-silicon (p-Si) layer or a poly-silicon (p-Si) layer doped with dopants. Alternatively, the semiconductor pattern 113 may include at least one of, for example, a metal, a metal silicide, a metal nitride, or a metal-containing film. The semiconductor pattern 113 may include an air gap or a void.

The liner insulating pattern 111 may be provided between the semiconductor pattern 113 and the semiconductor substrate 100. In an embodiment of the present inventive concept, the liner insulating pattern 111 may include a metal oxide such as, for example, hafnium oxide ($HfO_2$), aluminum oxide ($Al_2O_3$), and/or tantalum oxide ($Ta_2O_5$). In this case, the liner insulating pattern 111 may serve as a negative fixed charge layer, but the present inventive concept is not limited thereto. In an embodiment of the present inventive concept, the liner insulating pattern 111 may include at least one of a silicon oxide ($SiO_2$) layer, a silicon oxynitride (SiON) layer, or a silicon nitride ($Si_3N_4$) layer.

The barrier dopant region 115 may include dopants having the first conductivity type (e.g., a p-type) and may be provided in the semiconductor substrate 100 adjacent to a side surface of the liner insulating pattern 111. For example, the barrier dopant region 115 may include p-type dopants such as, for example, boron (B), aluminum (Al), gallium (Ga), and/or indium (In). A concentration of the dopants doped in the barrier dopant region 115 may be higher than a concentration of dopants in the semiconductor substrate 100. The barrier dopant region 115 may reduce a dark current caused by electron-hole pairs (EHPs) generated by surface defects of a pixel isolation trench formed in the semiconductor substrate 100.

In an embodiment of the present inventive concept, the first device isolation pattern 103 may be provided in a central portion of the second pixel group PG2. In other words, the first device isolation pattern 103 may be provided in common in at least four pixel regions PR constituting the second pixel group PG2.

The first device isolation pattern 103 may overlap a portion of the pixel isolation structure PIS. For example, the first device isolation pattern 103 may be disposed on the pixel isolation structure PIS between the first and second pixel regions PR1 and PR2. The first device isolation pattern 103 may be provided between the first and third isolation portions P1*a* and P2*a* when viewed in a plan view. The first device isolation pattern 103 may be disposed adjacent to the first surface 100*a* of the semiconductor substrate 100, and may be formed of an insulating material.

The first device isolation pattern 103 may be disposed on the first intersecting portion of the pixel isolation structure PIS, and may include a first portion parallel to the first direction D1, and a second portion intersecting the first portion and being parallel to the second direction D2. Here, the first portion of the first device isolation pattern 103 may overlap the first isolation portion P1*a* of the pixel isolation structure PIS, and the second portion of the first device isolation pattern 103 may overlap the third isolation portion P2*a* of the pixel isolation structure PIS. In addition, the first portion of the first device isolation pattern 103 may be shorter than the first isolation portion P1*a*, and the second portion of the first device isolation pattern 103 may be shorter than the third isolation portion P2*a*. A width of the first device isolation pattern 103 in the first or second direction D1 or D2 may be greater than a width of the pixel isolation structure PIS.

In an embodiment of the present inventive concept, the second device isolation pattern 105 may be provided in a central portion of the first pixel group PG1. The second device isolation pattern 105 may be provided in common in at least four pixel regions PR constituting the first pixel group PG1. The second device isolation pattern 105 may overlap a portion of the pixel isolation structure PIS. For example, the second device isolation pattern 105 may be disposed on the pixel isolation structure PIS between the second and third pixel regions PR2 and PR3. The second device isolation pattern 105 may be provided between the second and fourth isolation portions P1*b* and P2*b* when viewed in a plan view.

The second device isolation pattern 105 may be spaced apart from the first surface 100*a* of the semiconductor substrate 100 and may be disposed in the semiconductor substrate 100. The second device isolation pattern 105 may have a thickness smaller than a thickness of the first device isolation pattern 103, and may be formed of an insulating material the same as that of the first device isolation pattern 103. In an embodiment of the present inventive concept, the first device isolation pattern 103 adjacent to a floating diffusion region (FDa, FDb, FDc or FDd to be described) to which a high electric field is provided may remain, but the second device isolation pattern 105 may have large portion removed, and thus, the device isolation regions including the first and second device isolation patterns 103 and 105 may be minimized.

The photoelectric conversion region PD may be provided in the semiconductor substrate 100 of each of the pixel regions PR. The photoelectric conversion region PD may generate photocharges in proportion to an intensity of incident light. The photoelectric conversion region PD may be formed by ion-implanting dopants having a second conductivity type opposite to the first conductivity type of the semiconductor substrate 100 into the semiconductor substrate 100. A photodiode may be formed by a junction between the semiconductor substrate 100 having the first conductivity type and the photoelectric conversion region PD having the second conductivity type.

In an embodiment of the present inventive concept, a dopant concentration in a region of the photoelectric conversion region PD adjacent to the first surface 100*a* may be different from a dopant concentration in a region of the photoelectric conversion region PD adjacent to the second surface 100*b*, and thus the photoelectric conversion region PD may have a potential gradient between the first surface 100*a* and the second surface 100*b* of the semiconductor substrate 100. For example, the photoelectric conversion region PD may include a plurality of dopant regions stacked vertically.

In each of the pixel regions PR, a transfer gate electrode TGa, TGb, TGc or TGd may be disposed on the first surface 100*a* of the semiconductor substrate 100. The transfer gate electrode TGa, TGb, TGc or TGd may partially overlap the photoelectric conversion region PD when viewed in a plan view, and may be disposed in the semiconductor substrate 100. The transfer gate electrode TGa, TGb, TGc or TGd may include a lower portion inserted in the semiconductor substrate 100, and an upper portion connected to the lower portion and protruding above the first surface 100*a* of the semiconductor substrate 100. The lower portion of the transfer gate electrode TGa, TGb, TGc or TGd may vertically penetrate a portion of the semiconductor substrate 100. A bottom surface of the transfer gate electrode TGa, TGb, TGc or TGd may be located at a level lower than that of the first surface 100*a* of the semiconductor substrate 100. A gate insulating layer may be disposed between the transfer gate electrode TGa, TGb, TGc or TGd and the semiconductor substrate 100.

In an embodiment of the present inventive concept, a floating diffusion region FDa, FDb, FDc or FDd may be provided in the semiconductor substrate 100 of each of the pixel regions PR. The floating diffusion region FDa, FDb, FDc or FDd may be disposed adjacent to the first device isolation pattern 103.

The floating diffusion region FDa, FDb, FDc or FDd may vertically overlap a portion of the photoelectric conversion region PD. The floating diffusion region FDa, FDb, FDc or FDd may include dopants having the second conductivity type opposite to the first conductivity type of the semiconductor substrate 100. For example, the floating diffusion region FDa, FDb, FDc or FDd may be an n-type dopant region.

In an embodiment of the present inventive concept, the ground dopant region GR may be provided in the semiconductor substrate 100 in the central portion of the first pixel group PG1. The ground dopant region GR may be provided in common in at least four pixel regions PR constituting the first pixel group PG1. The ground dopant region GR may vertically overlap a portion of the pixel isolation structure PIS. The ground dopant region GR may be disposed on the second intersecting portion of the pixel isolation structure PIS, and may be provided between the second and fourth isolation portions P1*b* and P2*b* of the pixel isolation structure PIS when viewed in a plan view. The ground dopant region GR may be located away from the floating diffusion region FDa, FDb, FDc or FDd of each of the pixel regions PR in a diagonal direction.

The ground dopant region GR may be doped with dopants having the same conductivity type (i.e., the first conductivity type) as the semiconductor substrate 100. For example, the ground dopant region GR may be a p-type dopant region. The ground dopant region GR may be vertically spaced apart from the pixel isolation structure PIS by the second device isolation pattern 105. In other words, the ground dopant region GR to which a ground voltage is applied may be electrically isolated from the pixel isolation structure PIS to which a negative bias is applied. For example, the second device isolation pattern 105 may be disposed on the second portion (i.e., second intersecting portion) of the pixel isolation structure PIS, and the second device isolation pattern 105 may be provided in the first pixel group PG1 and disposed between the second portion of the pixel isolation structure PIS and the ground dopant region GR. For example, since the negative bias may be applied to the semiconductor pattern 113, which contains doped or undoped poly-silicon (p-Si), of the pixel isolation structure PIS, the second device isolation pattern 105 may remain between the ground dopant region GR and the pixel isolation structure PIS to electrically isolate the ground dopant region GR from the pixel isolation structure PIS. In addition, the barrier dopant region 115 may be vertically spaced apart from the ground dopant region GR with the second device isolation pattern 105 interposed therebetween.

The first interlayer insulating layers 120 may cover the transfer gate electrodes TGa, TGb, TGc and TGd on the first surface 100*a* of the semiconductor substrate 100, and may have a substantially flat top surface. For example, the first interlayer insulating layers 120 may include silicon oxide ($SiO_2$), silicon nitride ($Si_3N_4$), and/or silicon oxynitride (SiON).

An interconnection structure 121, 123 and 125 connected to the photoelectric conversion elements may be disposed in the first interlayer insulating layers 120. In detail, first contact plugs 121 may be connected to the floating diffusion regions FDa, FDb, FDc and FDd, respectively. For example, the first contact plug 121*a* may be connected to the floating diffusion region FDa, and the first contact plug 121*d* may be connected to the floating diffusion region FDd. Second contact plugs 123 may be connected to the ground dopant regions GR, respectively. Conductive patterns 125 may be connected to the first and second contact plugs 121 and 123.

In an embodiment of the present inventive concept, the floating diffusion regions FDa, FDb, FDc and FDd of the pixel regions PR constituting the second pixel group PG2 may be electrically connected in common to one of the conductive patterns 125.

In an embodiment of the present inventive concept, the pixel circuit layer 20 may be disposed on the first interlayer insulating layer 120 of the photoelectric conversion circuit layer 10.

The pixel circuit layer 20 may include the pixel circuits 20P of the unit pixels (see P of FIGS. 2A, 2B and 2C). Particularly, the pixel circuit layer 20 may include a semiconductor layer (or a second semiconductor layer) 200, a through-insulating pattern 210, pixel transistors PTR, and second interlayer insulating layers 220.

The semiconductor layer 200 may partially overlap at least one of the photoelectric conversion regions PD. The semiconductor layer 200 may overlap a portion of the pixel isolation structure PIS when viewed in a plan view. The semiconductor layer 200 may overlap the transfer gate electrodes TGa TGb, TGc and TGd.

The through-insulating pattern 210 may penetrate the semiconductor layer 200. A top surface of the through-insulating pattern 210 may be substantially coplanar with a top surface of the semiconductor layer 200. For example, the through-insulating pattern 210 may include, for example, silicon oxide ($SiO_2$), silicon nitride ($Si_3N_4$), and/or silicon oxynitride (SiON). In an embodiment of the present inventive concept, the through-insulating pattern 210 may overlap the ground dopant regions GR and the floating diffusion regions FDa, FDb, FDc and FDd.

The pixel transistors PTR may be provided on the semiconductor layer 200. The pixel transistors PTR may include the reset transistor RX of FIGS. 2A, 2B and 2C, the source follower transistor SF of FIGS. 2A, 2B and 2C, the dual conversion gain transistor DCX of FIGS. 2A and 2B, and the selection transistor SX of FIGS. 2A, 2B and 2C.

Each of the pixel transistors PTR may include a pixel gate electrode PG, and source/drain regions SDR provided in the semiconductor layer 200 at both sides of the pixel gate electrode PG.

The pixel gate electrode PG may include, for example, doped poly-silicon (p-Si), a metal, a conductive metal nitride, a conductive metal silicide, a conductive metal oxide, or a combination thereof. The source/drain regions SDR may be dopant regions doped in the semiconductor layer 200. For example, the source/drain regions SDR may include n-type dopants. In an embodiment of the present inventive concept, the source/drain regions SDR may be doped with n-type dopants such as, for example, phosphorus (P), arsenic (As), antimony (Sb) and/or bismuth (Bi).

A gate insulating layer may be disposed between the semiconductor layer 200 and the pixel gate electrodes PG. The gate insulating layer may be formed of, for example, a silicon oxide ($SiO_2$) layer, a silicon oxynitride (SiON) layer, a high-k dielectric layer having a dielectric constant higher than that of a silicon oxide ($SiO_2$) layer, or a combination thereof. As an example, the high-k dielectric material of the high-k dielectric layer may include at least one of, for example, hafnium oxide ($HfO_2$), hafnium silicon oxide ($HfSiO_4$), hafnium zirconium oxide ($HfZrO_4$), hafnium tantalum oxide ($Hf_2Ta_2O_9$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), lithium oxide ($Li_2O$), aluminum oxide ($Al_2O_3$), lead scandium tantalum oxide ($Pb(Sc,Ta)O_3$), or lead zinc niobate $[Pb(Zn_{1/3}Nb_{2/3})O_3]$.

The second interlayer insulating layers 220 may cover the pixel transistors PTR on the semiconductor layer 200. For example, the second interlayer insulating layers 220 may include, for example, silicon oxide ($SiO_2$), silicon nitride ($Si_3N_4$), and/or silicon oxynitride (SiON).

Upper contact plugs 221 may penetrate the second interlayer insulating layers 220 so as to be connected to the pixel gate electrode PG and the source/drain regions SDR. For example, the upper contact plugs 221 may include a metal such as, for example, tungsten (W), copper (Cu), aluminum (Al), or any alloy thereof.

First and second through-plugs TP1 and TP2 may penetrate the second interlayer insulating layers 220 and the through-insulating pattern 210 so as to be connected to the conductive patterns 125 of the photoelectric conversion circuit layer 10. The first through-plug TP1 may be connected to the floating diffusion regions FDa, FDb, FDc and FDd through the first contact plugs 121 and at least one of the conductive patterns 125. For example, the first through-plug TP1 may penetrate a first portion of the through-insulating pattern 210 so as to be connected to the floating diffusion regions FDa, FDb, FDc and FDd. The second through-plug TP2 may be connected to the ground dopant region GR through the second contact plug 123 and another of the conductive patterns 125. For example, the second through-plug TP2 may penetrate a second portion of the through-insulating pattern 210 so as to be connected to the ground dopant region GR.

Upper conductive patterns 223 may be connected to the upper contact plugs 221 and the first and second through-plugs TP1 and TP2.

The floating diffusion regions FDa, FDb, FDc and FDd may be electrically connected to the pixel transistors PTR of the pixel circuit layer 20 through the first through-plug TP1 and the upper conductive patterns 223.

In an embodiment of the present inventive concept, the light-transmitting layer 30 may be disposed on the second surface 100*b* of the semiconductor substrate 100. The light-transmitting layer 30 may include a planarization insulating layer 310, a grid structure 320, a protective layer 330, color filters 340, micro lenses 350, and a passivation layer 360. In other words, light may be incident on the second surface 100*b* of the semiconductor substrate 100 through the passivation layer 360, the micro lenses 350, the color filters 340, the protective layer 330 and the planarization insulating layer 310. The light-transmitting layer 30 may concentrate and filter light incident from the outside and may provide the concentrated and filtered light into the photoelectric conversion circuit layer 10.

The planarization insulating layer 310 may cover the second surface 100*b* of the semiconductor substrate 100. The planarization insulating layer 310 may be formed of a transparent insulating material and may include a plurality of layers. The planarization insulating layer 310 may be formed of an insulating material having a refractive index different from that of the semiconductor substrate 100. The planarization insulating layer 310 may include a metal oxide and/or silicon oxide ($SiO_2$). In an embodiment of the present inventive concept, the planarization insulating layer 310 may include a metal oxide, such as, for example, hafnium oxide ($HfO_2$), aluminum oxide ($Al_2O_3$), and/or tantalum oxide ($Ta_2O_5$).

The grid structure 320 may be disposed on the planarization insulating layer 310. Like the pixel isolation structure PIS, the grid structure 320 may have a grid or lattice shape when viewed in a plan view. The grid structure 320 may overlap the pixel isolation structure PIS when viewed in a plan view. In other words, the grid structure 320 may include first portions extending in the first direction D1, and second portions intersecting the first portions and extending in the second direction D2. A width of the grid structure 320 may be substantially equal to or smaller than a minimum width of the pixel isolation structure PIS.

The grid structure 320 may include a light-blocking pattern and/or a low-refractive index pattern. For example, the light-blocking pattern may include a metal material such as, for example, titanium (Ti), tantalum (Ta) or tungsten (W). The low-refractive index pattern may be formed of a material having a refractive index lower than that of the light-blocking pattern. The low-refractive index pattern may be formed of an organic material and may have a refractive index of about 1.1 to about 1.3. For example, the grid structure 320 may include a polymer layer including silica nanoparticles. In an embodiment of the present inventive concept, the low-refractive index pattern may further include a dye and/or a pigment.

The protective layer 330 may have a substantially uniform thickness and may cover a surface of the grid structure 320 on the planarization insulating layer 310. For example, the protective layer 330 may include a single layer or multi-layer of at least one of, for example, an aluminum oxide ($Al_2O_3$) layer or a silicon oxycarbide (SiOC) layer.

The color filters 340 may be formed to correspond to the pixel regions PR, respectively. The color filters 340 may fill spaces defined by the grid structure 320. Depending on properties of the unit pixel, each of the color filters 340 may include a red, green or blue color filter or may include a magenta, cyan or yellow color filter.

The micro lenses 350 may be disposed on the color filters 340. The micro lenses 350 may have convex shapes and may have a predetermined curvature radius. The micro lenses 350 may be formed of a transparent resin.

The passivation layer 360 may conformally cover surfaces of the micro lenses 350.

For example, the passivation layer 360 may be formed of an inorganic oxide.

Figure 5C:
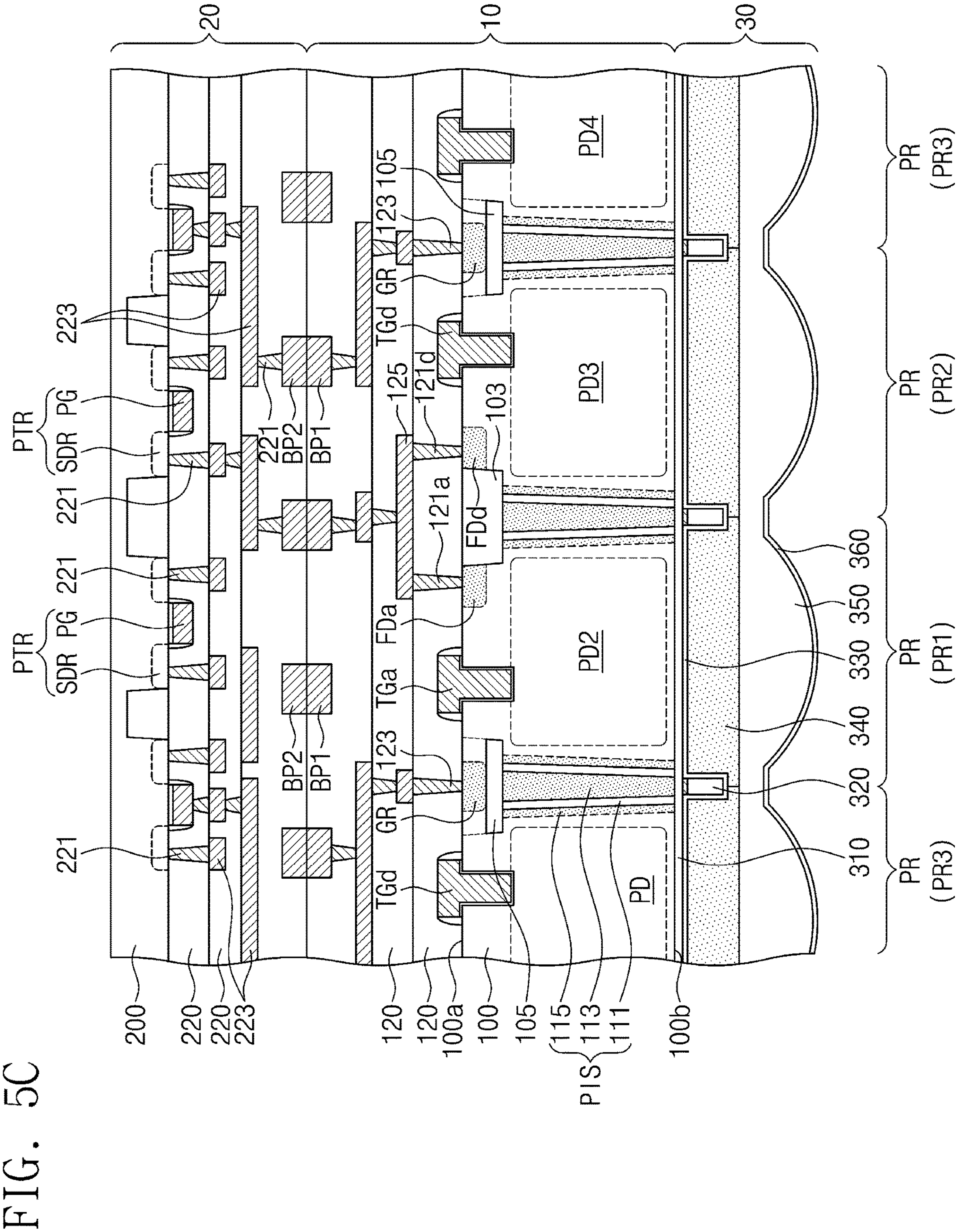
FIG. 5C is a cross-sectional view taken along line A-A' of FIG. 4 to illustrate an image sensor according to an embodiment of the present inventive concept.

FIG. 5C is a cross-sectional view taken along the line A-A' of FIG. 4 to illustrate an image sensor according to an embodiment of the present inventive concept. For the purpose of ease and convenience in explanation, the descriptions to the same technical features as in the above embodiments of FIGS. 4, 5A and 5B will be omitted, and differences between the present embodiments and the above embodiments of FIGS. 4, 5A and 5B will be mainly described hereinafter.

According to an embodiment of the present inventive concept shown in FIG. 5C, the photoelectric conversion circuit layer 10 and the pixel circuit layer 20 may be electrically connected to each other through first and second bonding pads BP1 and BP2, instead of the first and second through-plugs TP1 and TP2 of FIGS. 5A and 5B.

Referring to FIG. 5C, the photoelectric conversion circuit layer 10 may include the first bonding pads BP1 provided in an uppermost metal layer, and the pixel circuit layer 20 may include the second bonding pads BP2 provided in an uppermost metal layer, which is a lowermost metal layer of the pixel circuit layer 20 based on FIG. 5C. For example, the photoelectric conversion circuit layer 10 and the pixel circuit layer 20 may be individually formed, and then the pixel circuit layer 20 may be flipped upside down to bond to the photoelectric conversion circuit layer 10. For example, the first and second bonding pads BP1 and BP2 may include at least one of, for example, tungsten (W), aluminum (Al), copper (Cu), tungsten nitride (WN), tantalum nitride (TaN), or titanium nitride (TiN).

The first bonding pads BP1 of the photoelectric conversion circuit layer 10 may be connected to the transfer gate electrodes TGa, TGb, TGc and TGd, the floating diffusion regions FDa, FDb, FDc and FDd, and the ground dopant regions GR through the first and second contact plugs 121 and 123 and the conductive patterns 125.

The second bonding pads BP2 of the pixel circuit layer 20 may be connected to the pixel transistors PTR through the upper contact plugs 221 and the upper conductive patterns 223.

The photoelectric conversion circuit layer 10 and the pixel circuit layer 20 may be electrically connected to each other by directly bonding the first and second bonding pads BP1 and BP2 provided in the uppermost metal layers to each other.

The first bonding pads BP1 of the photoelectric conversion circuit layer 10 and the second bonding pads BP2 of the pixel circuit layer 20 may be connected directly to each other by a hybrid bonding method. The hybrid bonding method may mean a bonding method in which two components including the same kind of a material are fused into one at their interface. For example, when the first and second bonding pads BP1 and BP2 are formed of copper (Cu), the first and second bonding pads BP1 and BP2 may be physically and electrically connected to each other by a copper (Cu)-copper (Cu) bonding method. In addition, a surface of the first interlayer insulating layer 120 of the photoelectric conversion circuit layer 10 and a surface of the second interlayer insulating layer 220 of the pixel circuit layer 20 may be bonded to each other by a dielectric material-dielectric material bonding method.

Figure 6:
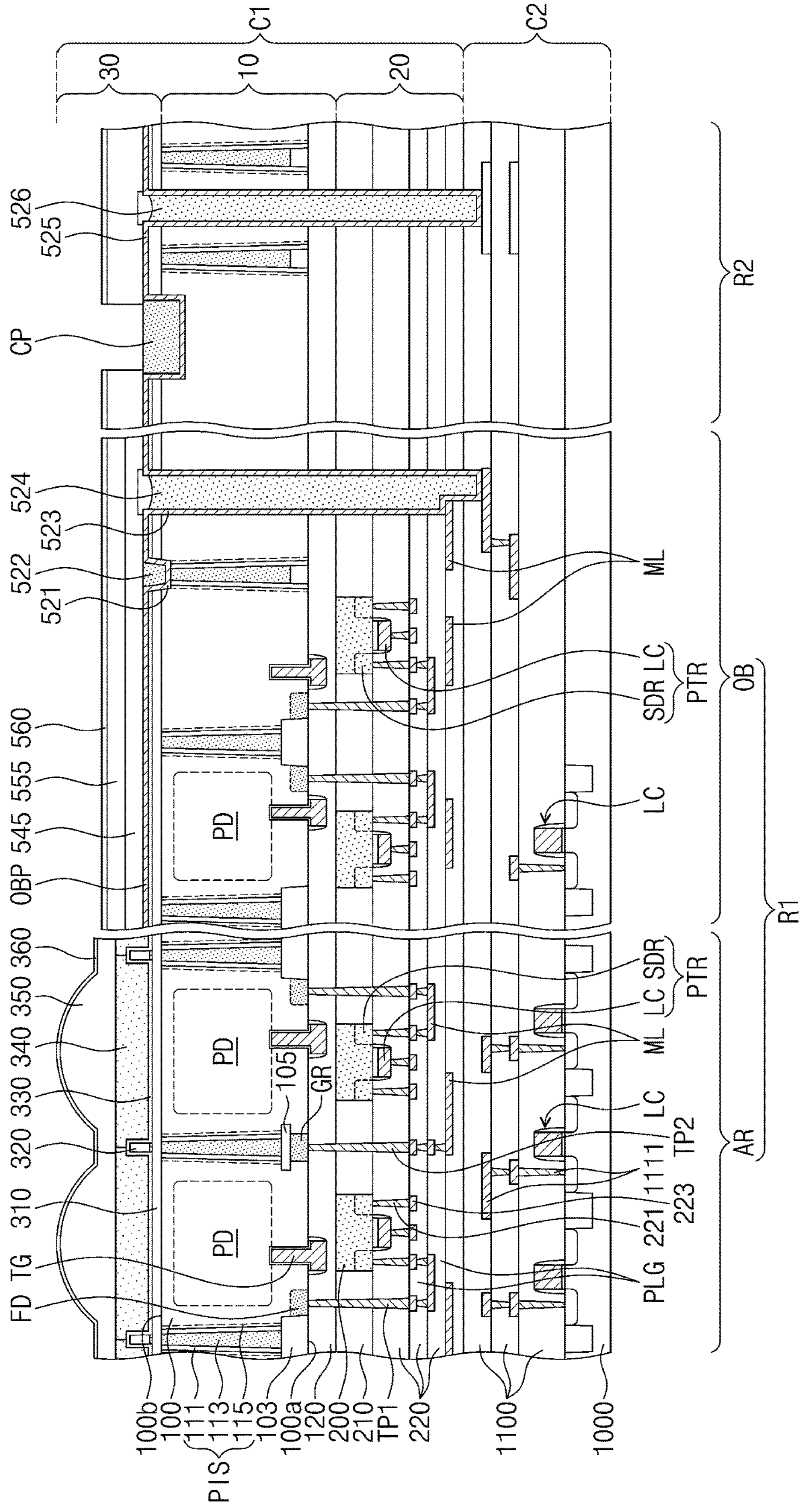
FIGS. 6, 7 and 8 are cross-sectional views illustrating image sensors each according to an embodiment of the present inventive concept.
Figure 7:
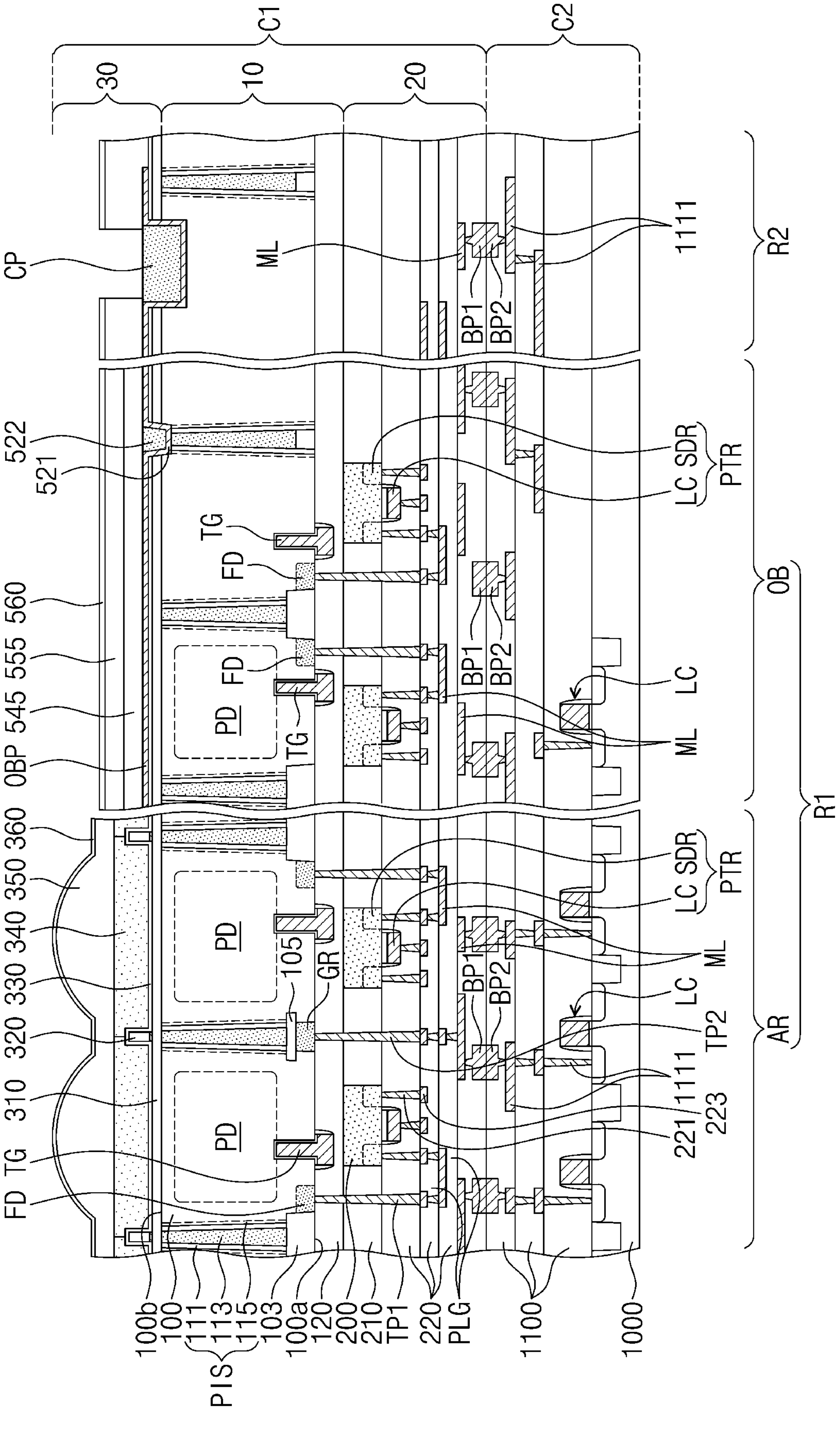
Figure 8:
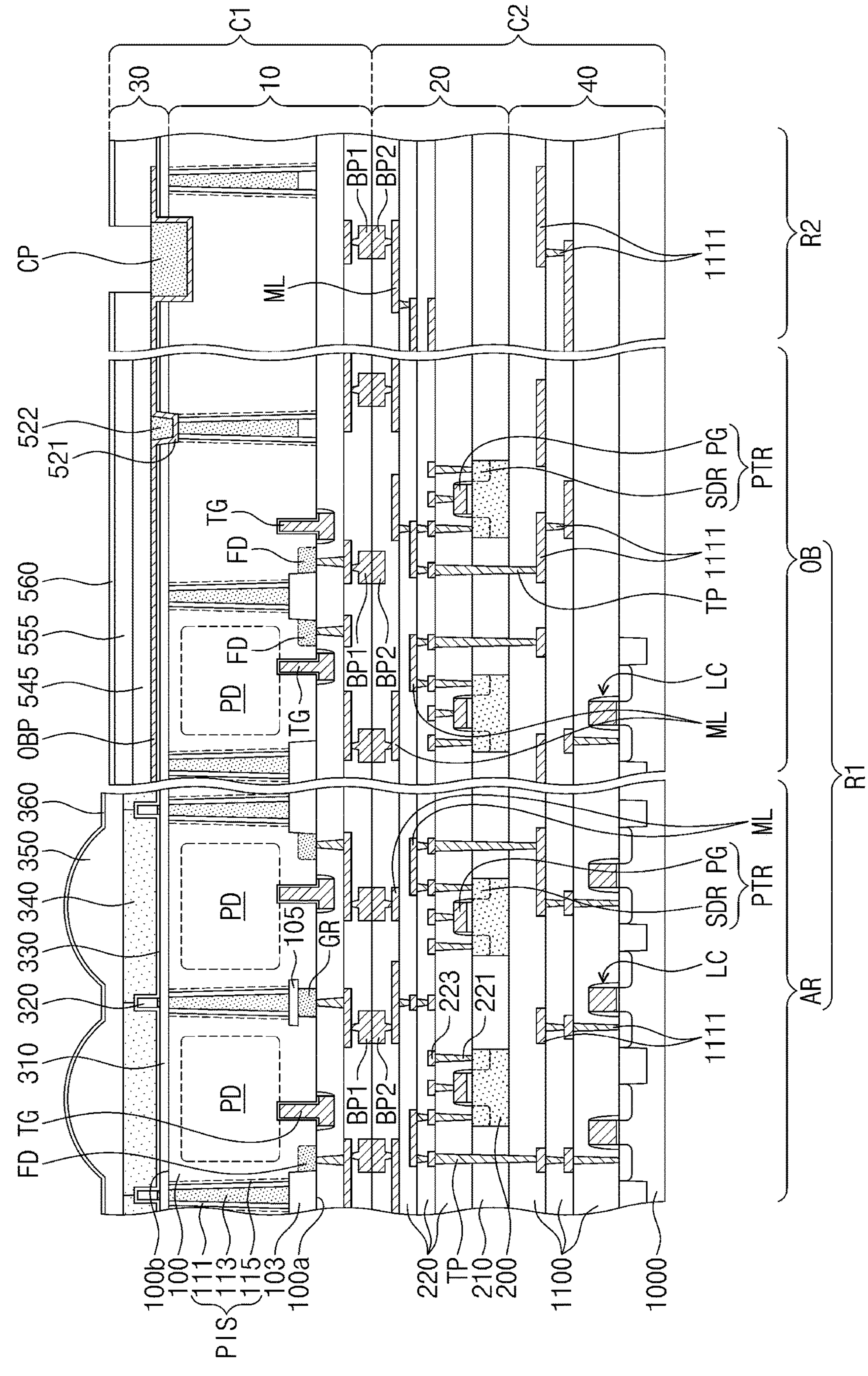

FIGS. 6, 7 and 8 are cross-sectional views illustrating image sensors each according to an embodiment of the present inventive concept. For the purpose of ease and convenience in explanation, the descriptions to the same technical features as in the above embodiment of FIGS. 4, 5A and 5B will be omitted, and differences between the present embodiments and the above embodiment of FIGS. 4, 5A and 5B will be mainly described hereinafter.

Referring to FIGS. 3A and 6, an image sensor may include a sensor chip C1 and a logic chip C2.

The sensor chip C1 may convert an image from an external object into electrical signals or data signals. The sensor chip C1 may include a photoelectric conversion circuit layer 10, a pixel circuit layer 20, and a light-transmitting layer 30, as described above.

The sensor chip C1 may include a pixel array region R1 and a pad region R2. The pixel array region R1 may include a plurality of unit pixels two-dimensionally arranged in the first and second directions D1 and D2 intersecting each other.

The pixel array region R1 may include a light-receiving region AR and a light-blocking region OB. The light-blocking region OB may be disposed around the light-receiving region AR. Reference pixels to which light is not incident may be provided in the light-blocking region OB, and magnitudes of electrical signals sensed from the unit pixels may be calculated by comparing the amount of reference charges generated from the reference pixels with the amount of charges sensed from the unit pixels of the light-receiving region AR.

The sensor chip C1 in the light-receiving region AR may have technical features the same as those of the image sensor described above. In other words, the sensor chip C1 may include the photoelectric conversion circuit layer 10 between the pixel circuit layer 20 and the light-transmitting layer 30 in a vertical view, as described above.

The photoelectric conversion circuit layer 10 may be disposed between the pixel circuit layer 20 and the light-transmitting layer 30 in a vertical view. As described above, the photoelectric conversion circuit layer 10 of the sensor chip C1 may include a semiconductor substrate 100, a pixel isolation structure PIS defining pixel regions, photoelectric conversion regions PD, transfer gate electrodes TG, floating diffusion regions FD, and first interlayer insulating layers 120. As described above, the semiconductor substrate 100 may include a first pixel group PG1 and a second pixel group PG2, and each of the first and second pixel groups PG1 and PG2 may include at least four pixel regions. The four pixel regions of the first pixel group PG1 may share a single ground dopant region GR.

The pixel isolation structure PIS may define the pixel regions in the light-receiving region AR and the light-blocking region OB, and a portion of the pixel isolation structure PIS may be electrically connected to a bias contact plug 521 in the light-blocking region OB.

The semiconductor pattern 113 of the pixel isolation structure PIS may have a single body entirely provided in the pixel array region R1. In other words, the semiconductor pattern 113 may have a single body provided in common in the light-receiving region AR and the light-blocking region OB.

The semiconductor pattern 113 may be connected to the bias contact plug 521 in the light-blocking region OB. For example, the bias contact plug 521 may penetrate a portion of the pixel isolation structure PIS so as to be connected to the semiconductor pattern 113. The bias contact plug 521 may have a width greater than a width of the pixel isolation structure PIS. The bias contact plug 521 may include a metal and/or a metal nitride. For example, the bias contact plug 521 may include, for example, titanium (Ti) and/or titanium nitride (TiN).

A contact pattern 522 may fill a contact hole in which the bias contact plug 521 is formed. The contact pattern 522 may include a different material from that of the bias contact plug 521. For example, the contact pattern 522 may include aluminum (Al).

A negative bias may be applied to the semiconductor pattern 113 through the contact pattern 522 and the bias contact plug 521. The negative bias may be transmitted from the light-blocking region OB to the light-receiving region AR. Since the negative bias is applied to the semiconductor pattern 113 of the pixel isolation structure PIS, holes may be accumulated in the barrier dopant region 115. Thus, it is possible to reduce a dark current generated at a boundary between the pixel isolation structure PIS and the semiconductor substrate 100.

The pixel circuit layer 20 may include a semiconductor layer 200 on the first interlayer insulating layer 120, pixel transistors PTR provided on the semiconductor layer 200, and second interlayer insulating layers 220. The pixel transistors PTR may be connected to the photoelectric conversion circuit layer 10 through first and second through-plugs TP1 and TP2.

The light-transmitting layer 30 may include a planarization insulating layer 310, a grid structure 320, a protective layer 330, color filters 340, micro lenses 350, and a passivation layer 360.

The planarization insulating layer 310 may extend from the light-receiving region AR into the light-blocking region OB and the pad region R2.

In the light-blocking region OB, a light-blocking pattern OBP may be disposed on the planarization insulating layer 310. The light-blocking pattern OBP may prevent light from being incident to photoelectric conversion regions PD provided in the light-blocking region OB. The photoelectric conversion regions PD in reference pixel regions of the light-blocking region OB may not output photoelectric signals but may output noise signals. The noise signals may be generated by electrons generated by generated heat or a dark current. For example, the light-blocking pattern OBP may include a metal such as, for example, tungsten (W), copper (Cu), aluminum (Al), or any alloy thereof.

A filtering layer 545 may be provided on the light-blocking pattern OBP. The filtering layer 545 may block light having a different wavelength from those of light blocked by the color filters 340. For example, the filtering layer 545 may block infrared light. The filtering layer 545 may include, but not limited to, a blue color filter. A micro lens layer 555 may be provided on the filtering layer 545, and a passivating layer 560 may be provided on the micro lens layer 555.

The bias contact plug 521 may be provided on the second surface 100*b* of the light-blocking region OB of the semiconductor substrate 100. A contact trench may be formed in the second surface 100*b* of the semiconductor substrate 100, and the bias contact plug 521 may be provided in the contact trench.

The contact pattern 522 may be connected to the bias contact plug 521. The contact pattern 522 may include a conductive material different from that of the bias contact plug 521. For example, the contact pattern 522 may include aluminum (Al). The contact pattern 522 may be electrically connected to the semiconductor pattern 113 of the pixel isolation structure PIS.

The logic chip C2 may be bonded to the sensor chip C1 so as to be adjacent to the pixel circuit layer 20 of the sensor chip C1. The logic chip C2 may include a power circuit, an input/output interface, and an image signal processor.

The logic chip C2 may include a logic semiconductor substrate 1000, logic circuits LC, interconnection structures 1111 connected to the logic circuits LC, and logic interlayer insulating layers 1100. An uppermost one of the logic interlayer insulating layers 1100 may be bonded to the pixel circuit layer 20 of the sensor chip C1. The logic chip C2 may be electrically connected to the sensor chip C1 through a first through-conductive pattern 523 and a second through-conductive pattern 525.

In the light-blocking region OB, the first through-conductive pattern 523 may penetrate the semiconductor substrate 100 so as to be electrically connected to at least one of conductive lines ML of the pixel circuit layer 20 and at least one of the interconnection structures 1111 of the logic chip C2. The first through-conductive pattern 523 may have a first bottom surface and a second bottom surface, which are located at different levels. A first gap-fill pattern 524 may be provided in an inner space surrounded by the first through-conductive pattern 523. The first gap-fill pattern 524 may include a low-refractive index material and may have an insulating property.

A plurality of conductive pads CP used to input/output control signals and photoelectric signals may be disposed in the pad region R2. The conductive pads CP may be used to input/output electrical signals generated from the unit pixels to an external device.

In the pad region R2, the conductive pads CP may be buried in the second surface 100*b* of the semiconductor substrate 100. For example, each of the conductive pads CP may be provided in a pad trench formed through the second surface 100*b* of the semiconductor substrate 100 in the pad region R2. The conductive pads CP may include a metal such as, for example, aluminum (Al), copper (Cu), tungsten (W), titanium (Ti), tantalum (Ta), or any alloy thereof. In a process of mounting the image sensor, bonding wires may be bonded to the conductive pads CP. The conductive pads CP may be electrically connected to the external device through the bonding wires.

In the pad region R2. the second through-conductive pattern 525 may penetrate the semiconductor substrate 100 so as to be electrically connected to logic conductive lines of the logic chip C2. The second through-conductive pattern 525 may extend onto the second surface 100*b* of the semiconductor substrate 100 so as to be electrically connected to the conductive pads CP. A portion of the second through-conductive pattern 525 may cover a bottom surface and side surfaces of the conductive pad CP. A second gap-fill pattern 526 may be provided in an inner space surrounded by the second through-conductive pattern 525. The second gap-fill pattern 526 may include a low-refractive index material and may have an insulating property. In the pad region R2, the pixel isolation structure PIS may be provided around the second through-conductive pattern 525. Referring to FIG. 3A, in an embodiment of the present inventive concept, the conductive pads CP in the pad region R2 of the sensor chip C1 may be electrically connected to the conductive pads in the logic pad region R3 of the logic chip C2 by a second through-conductive pattern 525.

The sensor chip C1 and the logic chip C2 are electrically connected to each other through the first and second through-conductive patterns 523 and 525 in the present embodiments, but the present inventive concept is not limited thereto.

According to an embodiment of the present inventive concept shown in FIG. 7, the first and second through-conductive patterns 523 and 525 of FIG. 6 may be omitted, and first and second bonding pads BP1 and BP2 provided in uppermost metal layers of the sensor chip C1 and the logic chip C2 may be bonded directly to each other to electrically connect the sensor chip C1 and the logic chip C2 to each other.

The sensor chip C1 may include the first bonding pads BP1 provided in an uppermost metal layer of the pixel circuit layer 20, and the logic chip C2 may include the second bonding pads BP2 provided in an uppermost metal layer of the interconnection structures 1111. The first bonding pads BP1 may be formed in the second interlayer insulating layer 220 of the sensor chip C1, and the second bonding pads BP2 may be formed in the logic interlayer insulating layer 1100 of the logic chip C2.

The logic chip C2 may correspond to a logic circuit layer 40 to be described. In FIG. 7, the first bonding pads BP1 may be connected to the pixel transistors PTR. The logic circuit layer 40 (the logic chip C2 in FIG. 7) may include logic circuits LC provided on the logic semiconductor substrate 1000, and the second bonding pads BP2 may be connected to the logic circuits LC and bonded to the first bonding pads BP1.

The first bonding pads BP1 of the sensor chip C1 and the second bonding pads BP2 of the logic chip C2 may be electrically connected directly to each other by a hybrid bonding method. A surface of the second interlayer insulating layer 220 of the pixel circuit layer 20 may be bonded to a surface of the logic interlayer insulating layer 1100 of the logic chip C2 by a dielectric material-dielectric material bonding method.

According to an embodiment of the present inventive concept shown in FIGS. 3B and 8, a sensor chip C1 may include a photoelectric conversion circuit layer 10 and a light-transmitting layer 30, and a logic chip C2 may include a pixel circuit layer 20 and a logic circuit layer 40.

The photoelectric conversion circuit layer 10 may include first bonding pads BP1 provided in an uppermost metal layer. Here, the first bonding pads BP1 may be connected to the transfer gate electrodes TG, the floating diffusion regions FD, and the ground dopant regions GR through contact plugs and interconnection lines.

The logic circuit layer 40 may include the logic semiconductor substrate 1000, the logic circuits LC, the interconnection structures 1111 connected to the logic circuits LC, and the logic interlayer insulating layers 1100.

The semiconductor layer 200 of the pixel circuit layer 20 may be disposed on the logic interlayer insulating layer 1100. As described above, the pixel circuit layer 20 may include the semiconductor layer 200, the through-insulating pattern 210, the pixel transistors PTR, and the second interlayer insulating layers 220. The pixel circuit layer 20 may be electrically connected to the logic circuits LC of the logic circuit layer 40 through through-plugs TP.

The logic circuit layer 40 may include the logic circuits LC provided on the logic semiconductor substrate 1000 and connected to the pixel transistors PTR, and through-plugs TP, which may also be referred to as logic through-plugs, penetrating the semiconductor layer 200 to connect the logic circuits LC and the pixel transistors PTR to each other.

The pixel circuit layer 20 may include second bonding pads BP2 provided in an uppermost metal layer. The second bonding pads BP2 may be bonded directly to the first bonding pads BP1 of the photoelectric conversion circuit layer 10.

FIGS. 9 to 16 are cross-sectional views illustrating a method of manufacturing an image sensor according to an embodiment of the present inventive concept.

Figure 9:
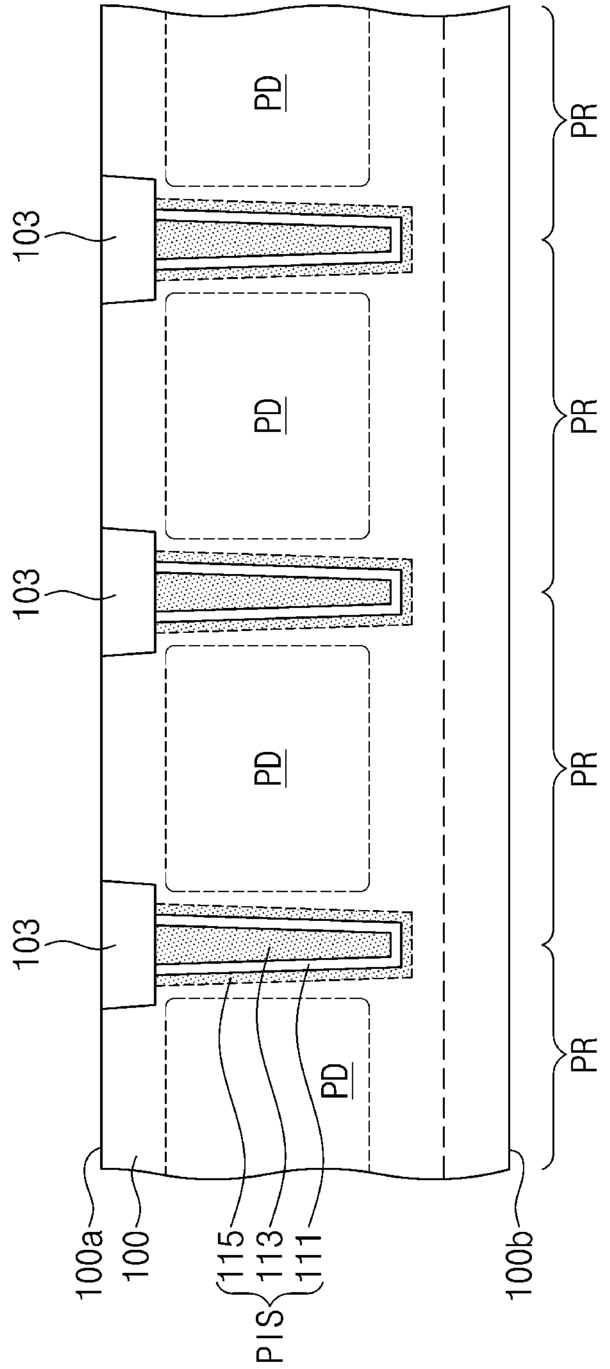
FIGS. 9 to 16 are cross-sectional views illustrating a method of manufacturing an image sensor according to an embodiment of the present inventive concept.

Referring to FIGS. 4 and 9, a semiconductor substrate 100 having a first conductivity type (e.g., a p-type) may be provided. For example, the semiconductor substrate 100 may include an epitaxial layer. The semiconductor substrate 100 may have a first surface 100*a* and a second surface 100*b*, which are opposite to each other.

A pixel isolation structure PIS defining pixel regions PR may be formed in the semiconductor substrate 100, and a first device isolation pattern 103 may be formed on portions of the pixel isolation structure PIS.

The formation of the pixel isolation structure PIS may include patterning the first surface 100*a* of the semiconductor substrate 100 to form a deep trench in the semiconductor substrate 100, forming a liner insulating layer conformally covering an inner surface of the deep trench, depositing a semiconductor layer filling the deep trench having the liner insulating layer, forming a barrier dopant region 115 doped along the inner surface of the deep trench, and forming a filling insulation layer filling the deep trench having the liner insulating layer and the semiconductor layer. The liner insulating layer may be conformally formed by using a chemical vapor deposition (CVD) process, an atomic layer deposition (ALD) process, or other suitable process. In an embodiment of the present inventive concept, before the formation of the deep trench, the first surface 100*a* of the semiconductor substrate 100 may be patterned to form a device isolation trench, and the deep trench may be formed by patterning a filling insulation layer filling the device isolation trench and the semiconductor substrate 100.

The barrier dopant region 115 adjacent to a side surface of the deep trench may be formed before the formation of the semiconductor layer filling the deep trench. A sacrificial layer including dopants having the first conductivity type may be formed in the deep trench, and the dopants in the sacrificial layer may be diffused into the semiconductor substrate 100 by a thermal treatment process, thereby forming the barrier dopant region 115. For example, the barrier dopant region 115 may include p-type dopants. For example, the barrier dopant region 115 may include p-type dopants such as, for example, boron (B), aluminum (Al), gallium (Ga), and/or indium (In).

Since the pixel isolation structure PIS is formed as described above, a liner insulating pattern 111 and a semiconductor pattern 113 may be formed. For example, the liner insulating pattern 111 may include, for example, silicon oxide ($SiO_2$), silicon nitride ($Si_3N_4$), and/or silicon oxynitride (SiON). The semiconductor pattern 113 may include a poly-silicon (p-Si) layer doped with dopants and/or an undoped poly-silicon (p-Si) layer.

After the formation of the pixel isolation structure PIS, the first device isolation pattern 103 may be formed in the device isolation trench adjacent to the first surface 100*a* of the semiconductor substrate 100. By a planarization process exposing the first surface 100*a* of the semiconductor substrate 100, a top surface of the pixel isolation structure PIS may be substantially coplanar with a top surface of the first device isolation pattern 103. An etch-back or chemical mechanical polishing (CMP) process may be employed to planarize the first device isolation pattern 103.

Next, photoelectric conversion regions PD may be formed in the semiconductor substrate 100. For example, the photoelectric conversion region PD may be formed by performing an ion implantation process on the first surface 100*a* of the semiconductor substrate 100. Each of the photoelectric conversion regions PD may be formed by doping the semiconductor substrate 100 of each of the pixel regions PR with dopants having a second conductivity type (e.g., an n-type) different from the first conductivity type. In an embodiment of the present inventive concept, a photoelectric conversion region PD may include a photodiode region and a well region. The photodiode region may be doped with n-type dopants, and the well region may be doped with p-type dopants.

Figure 10:
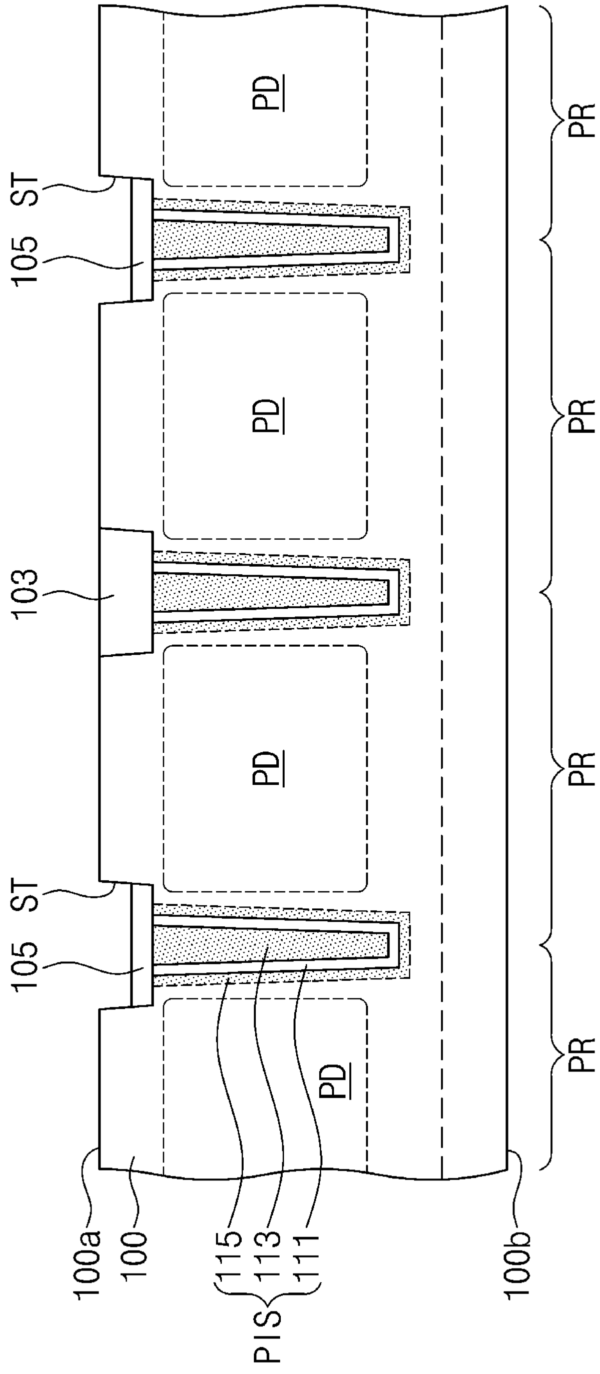

Referring to FIGS. 4 and 10, a portion of the first device isolation pattern 103 on a portion of the pixel isolation structure PIS in a first pixel group PG1 may be recessed. Thus, a side surface of the device isolation trench ST may be exposed, and a second device isolation pattern 105 may be formed.

Figure 11:
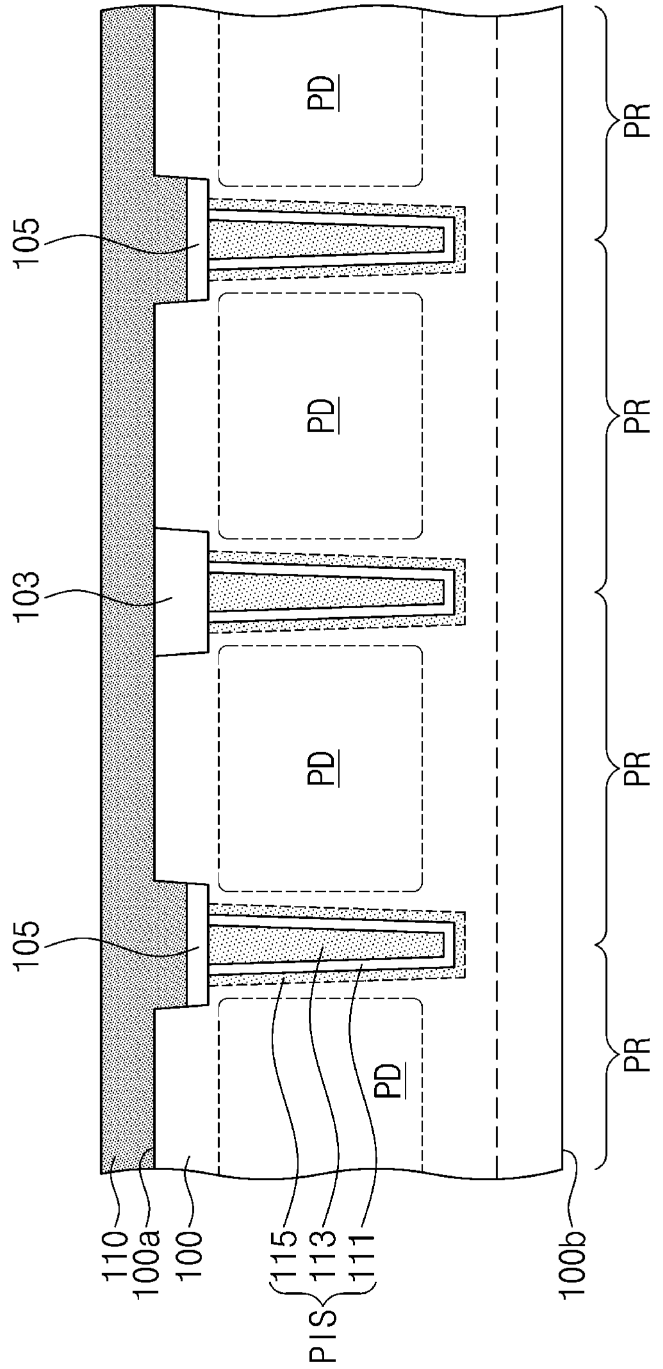

Referring to FIGS. 4 and 11, an amorphous semiconductor layer 110 may be formed on the first surface 100*a* of the semiconductor substrate 100. The amorphous semiconductor layer 110 may fill the device isolation trench ST in which the second device isolation pattern 105 is formed. The amorphous semiconductor layer 110 may be formed by performing a solid phase epitaxy (SPE) process or a liquid phase epitaxy (LEG) process.

Subsequently, a recrystallization process of crystallizing the amorphous semiconductor layer 110 into a single-crystalline semiconductor layer may be performed. For example, the recrystallization process may use a solid phase epitaxy (SPE) process. Alternatively, the recrystallization process may use, for example, a laser annealing process, a rapid thermal process (RTP), or a milli-second annealing (MSA) process.

When heat energy is supplied to the amorphous semiconductor layer 110, the amorphous semiconductor layer 110 may be melted and then may be epitaxial-grown using both side surfaces of the device isolation trench ST as a seed while being crystallized in a direction toward a center of the device isolation trench ST.

Figure 12:
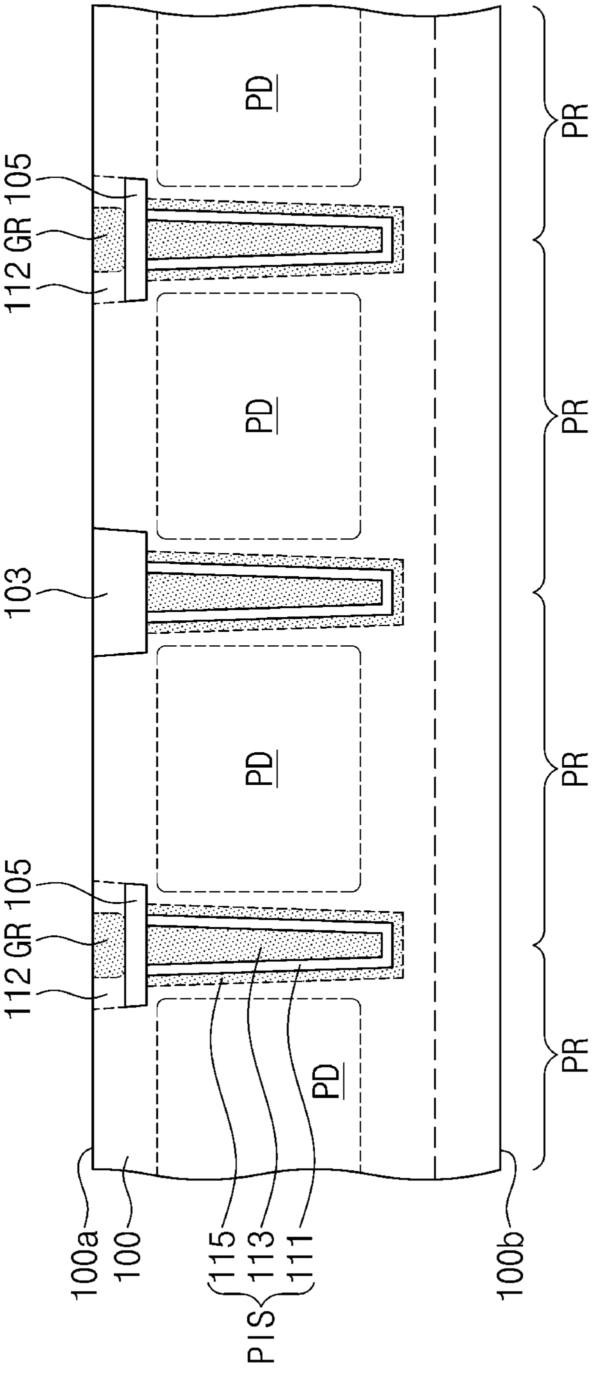

Referring to FIGS. 4 and 12, after the formation of the single-crystalline semiconductor layer, a planarization process may be performed to expose the first surface 100*a* of the semiconductor substrate 100. An etch-back or chemical mechanical polishing (CMP) process may be employed to planarize the amorphous semiconductor layer 110 after crystallization. Thus, a single-crystalline semiconductor pattern 112 may be formed on the second device isolation pattern 105 in the device isolation trench ST. The single-crystalline semiconductor pattern 112 may have the same crystal structure as the semiconductor substrate 100 and may be formed of the same semiconductor material as the semiconductor substrate 100, and thus an interface between the single-crystalline semiconductor pattern 112 and the semiconductor substrate 100 may not be visible.

Subsequently, a ground dopant region GR may be formed in the single-crystalline semiconductor pattern 112 (i.e., the semiconductor substrate 100). The ground dopant region GR may be doped with dopants having the same conductivity type (e.g., the p-type) as the semiconductor substrate 100.

Figure 13:
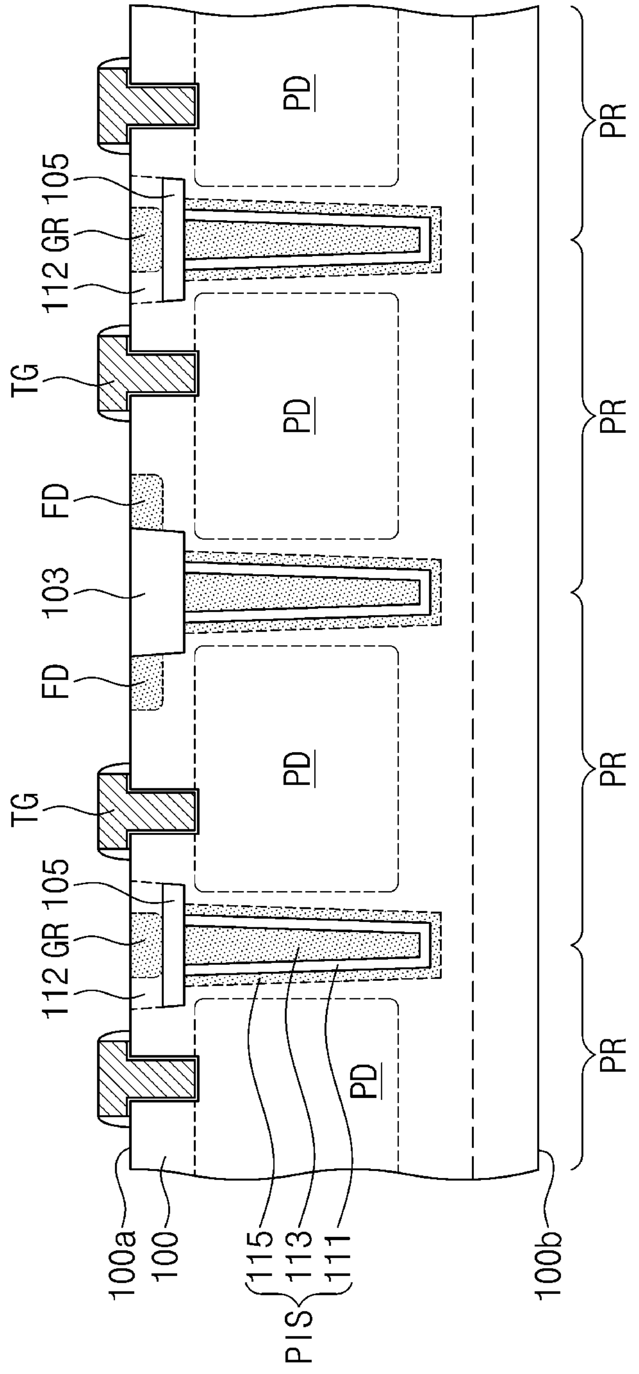

Referring to FIGS. 4 and 13, transfer gate electrodes TG may be formed in the pixel regions PR, respectively. The formation of the transfer gate electrodes TG may include patterning the semiconductor substrate 100 to form gate recess regions in the pixel regions PR, respectively, forming a gate insulating layer conformally covering inner surfaces of the gate recess regions, forming a gate conductive layer filling the gate recess regions, and patterning the gate conductive layer.

Floating diffusion regions FD may be formed in the semiconductor substrate 100. The floating diffusion regions FD may be formed by ion-implanting dopants having the second conductivity type using an ion implantation mask. The floating diffusion regions FD may be adjacent to the first device isolation pattern 103.

Figure 14:
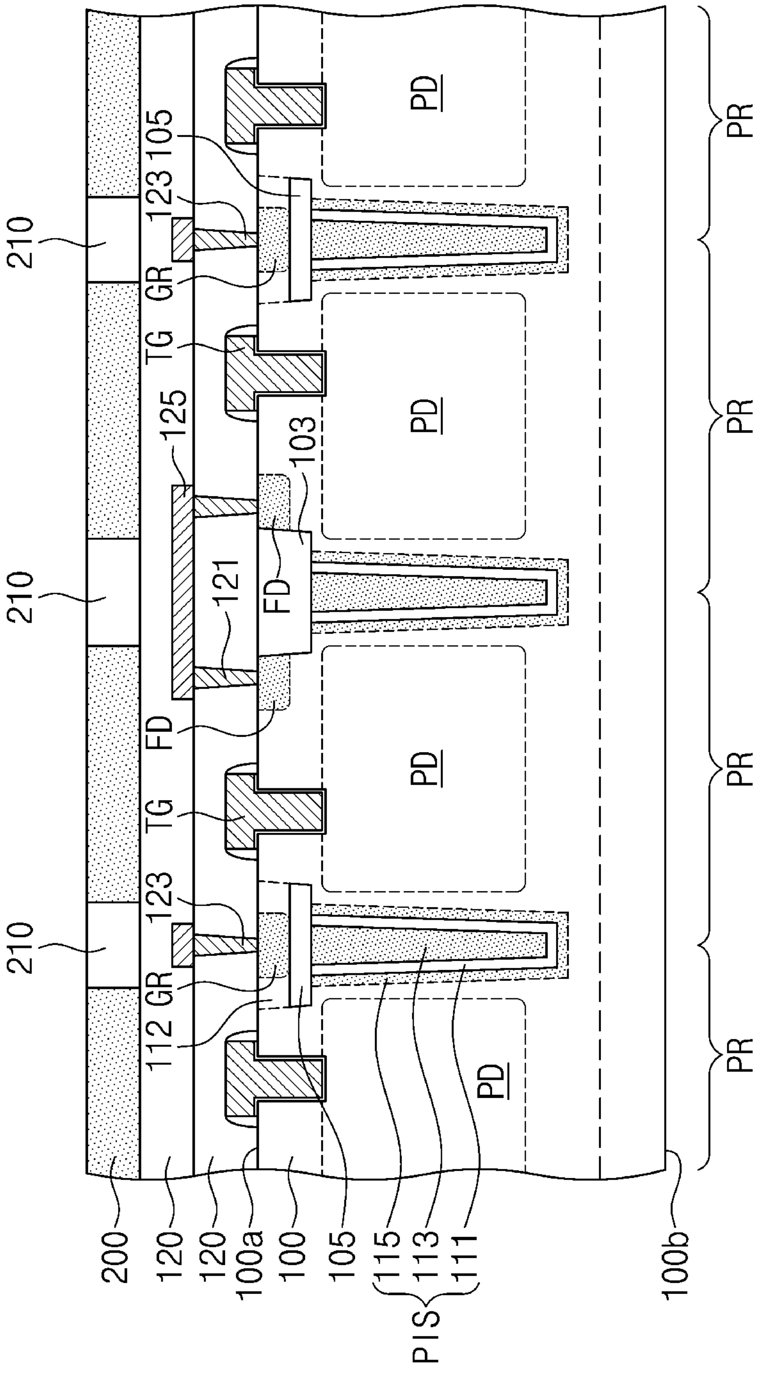

Referring to FIGS. 4 and 14, first interlayer insulating layers 120 and an interconnection structure 121, 123 and 125 may be formed on the first surface 100*a* of the semiconductor substrate 100.

The first interlayer insulating layers 120 may cover the transfer gate electrodes TG and the first surface 100*a* of the semiconductor substrate 100. The first interlayer insulating layers 120 may be formed of a material having an excellent gap-fill property, and a top of the first interlayer insulating layers 120 may be planarized. For example, the first interlayer insulating layers 120 may include silicon oxide ($SiO_2$), silicon nitride ($Si_3N_4$), and/or silicon oxynitride (SiON).

First and second contact plugs 121 and 123 connected to the floating diffusion regions FD and the ground dopant regions GR may be formed in the first interlayer insulating layers 120. Conductive patterns 125 may be formed between the first interlayer insulating layers 120. For example, the first and second contact plugs 121 and 123 and the conductive patterns 125 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), a combination thereof, or an alloy thereof.

A semiconductor layer 200 may be formed on the first interlayer insulating layer 120. The formation of the semiconductor layer 200 may include bonding a second semiconductor substrate, on which a hydrogen ion implantation process is performed, onto the first interlayer insulating layer 120, performing a thermal treatment process, and removing a portion of the second semiconductor substrate while leaving a remaining portion of the second semiconductor substrate.

Next, a through-insulating pattern 210 penetrating the semiconductor layer 200 may be formed. The formation of the through-insulating pattern 210 may include patterning the semiconductor layer 200 to form a through-hole exposing the first interlayer insulating layer 120, depositing an insulating layer filling the through-hole, and performing a planarization process on the insulating layer to expose a top surface of the semiconductor layer 200. An etch-back or chemical mechanical polishing (CMP) process may be employed to planarize the through-insulating pattern 210. The through-insulating pattern 210 may include at least one of, for example, silicon oxide ($SiO_2$), silicon oxynitride (SiON), or silicon nitride ($Si_3N_4$).

Figure 15:
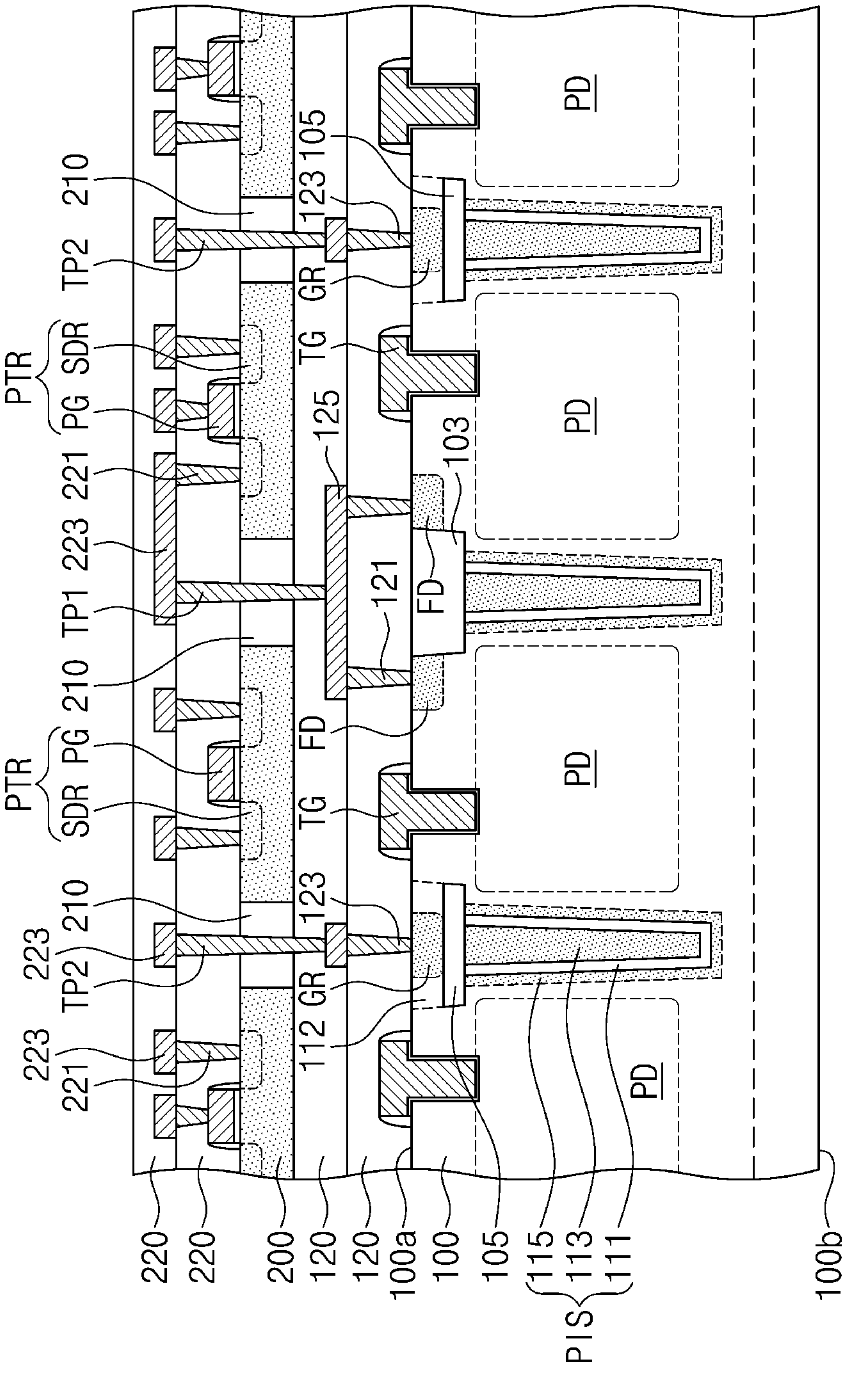

Referring to FIGS. 4 and 15, after the formation of the through-insulating pattern 210, pixel gate electrodes PG may be formed on the semiconductor layer 200 with a gate insulating layer interposed therebetween. After the formation of the pixel gate electrodes PG, source/drain regions SDR may be formed in the semiconductor layer 200 at both sides of each of the pixel gate electrodes PG.

The pixel gate electrodes PG may include a high-melting point metal (e.g., cobalt (Co), titanium (Ti), nickel (Ni), tungsten (W), and/or molybdenum (Mo)) and/or a metal nitride (e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), and/or tungsten nitride (WN)).

Second interlayer insulating layers 220 may be formed to cover the pixel transistors PTR. In addition, first and second through-plugs TP1 and TP2, upper contact plugs 221 and upper conductive patterns 223 may be formed to connect the pixel transistors PTR to the floating diffusion regions FD and the transfer gate electrodes TG of the semiconductor substrate 100.

Lengths of the upper contact plugs 221 may be different from lengths of the first and second through-plugs TP1 and TP2, and top surfaces of the upper contact plugs 221 and the first and second through-plugs TP1 and TP2 may be located at substantially the same level.

The upper conductive patterns 223 may be formed between the second interlayer insulating layers 220. The upper conductive patterns 223 for electrical connection of the pixel transistors PTR may be disposed without restrictions on position. For example, the first and second through-plugs TP1 and TP2, the upper contact plugs 221 and the upper conductive patterns 223 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), a combination thereof, or an alloy thereof.

Figure 16:
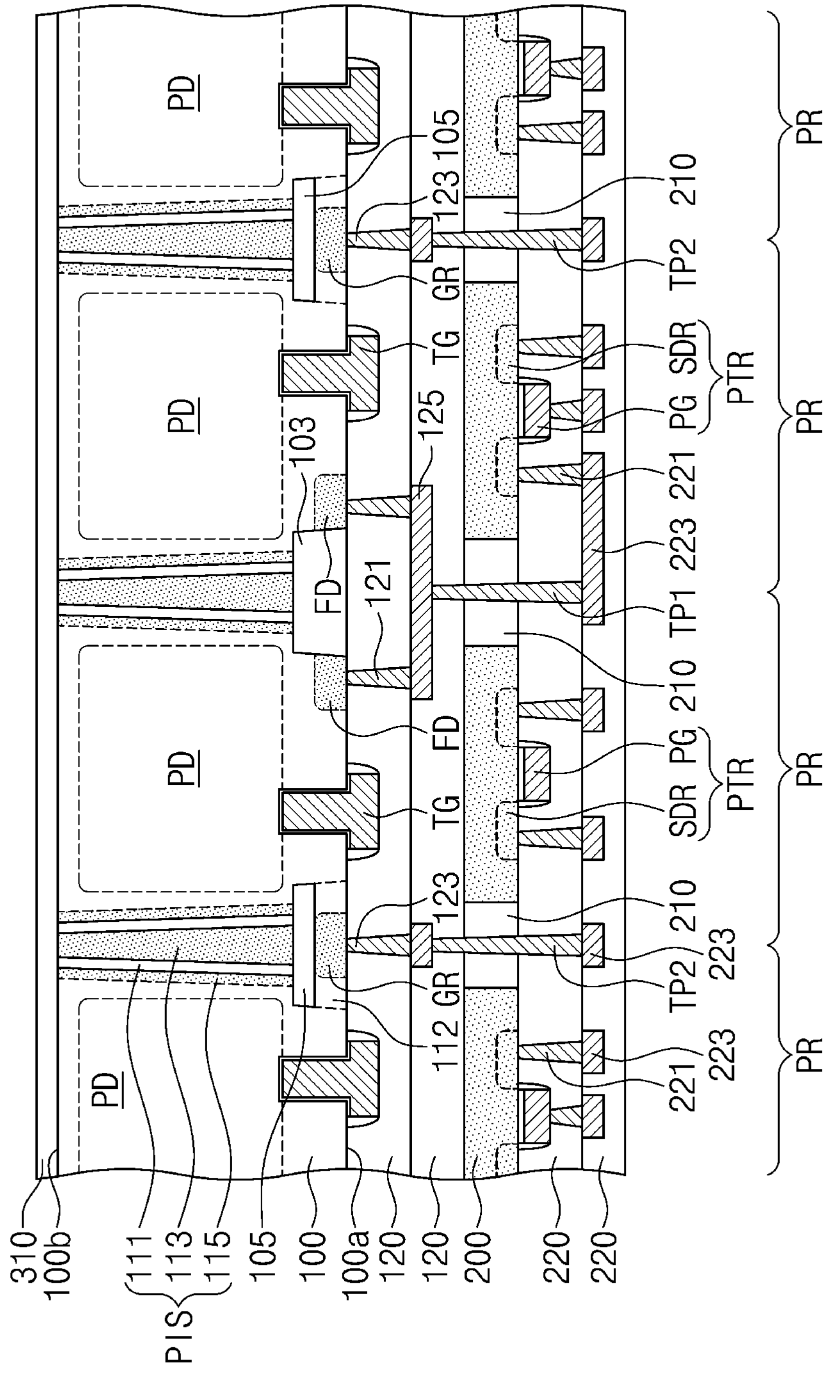

Referring to FIGS. 4 and 16, a thinning process of removing a portion of the semiconductor substrate 100 may be performed to reduce a vertical thickness of the semiconductor substrate 100. The semiconductor substrate 100 may be turned over to thin the semiconductor substrate 100. The thinning process may include grinding or polishing and anisotropically and/or isotropically etching the second surface 100*b* of the semiconductor substrate 100.

By the grinding or polishing process, a bulk silicon substrate of the semiconductor substrate 100 may be removed and the epitaxial layer may be exposed. Subsequently, the anisotropic and/or isotropic etching process may be performed to remove surface defects existing at an exposed surface of the epitaxial layer. The exposed surface of the epitaxial layer may correspond to the second surface 100*b* of the semiconductor substrate 100.

By the thinning process on the semiconductor substrate 100, the semiconductor pattern 113 of the pixel isolation structure PIS may be exposed at the second surface 100*b* of the semiconductor substrate 100. A surface of the semiconductor pattern 113 and a surface of the liner insulating pattern 111 may be located at a level substantially the same as that of the second surface 100*b* of the semiconductor substrate 100.

Next, a planarization insulating layer 310 may be formed on the second surface 100*b* of the semiconductor substrate 100. The planarization insulating layer 310 may cover the surface of the semiconductor pattern 113 and the second surface 100*b* of the semiconductor substrate 100. The planarization insulating layer 310 may be formed by depositing a metal oxide such as, for example, aluminum oxide ($Al_2O_3$) and/or hafnium oxide ($HfO_2$).

Thereafter, a grid structure 320, color filters 340 and micro lenses 350 may be formed on the planarization insulating layer 310, as illustrated in FIGS. 5A and 5B.

According to the embodiments of the present inventive concept, the pixel transistors provided in the pixel regions may be formed on the semiconductor layer located at a different level from that of the semiconductor substrate having the photoelectric conversion regions. Thus, an integration density of the image sensor may be enhanced, and performance of the pixel transistors may be secured even though a size of the unit pixel is reduced.

According to the embodiments of the present inventive concept, each of the ground dopant regions provided in the semiconductor substrate together with the photoelectric conversion regions may be provided in common in four pixel regions, and thus the size of the unit pixel may be further reduced.

While embodiments of the present inventive concept have been particularly shown and described, it will be understood by one of ordinary skill in the art that variations in form and detail may be made therein without departing from the spirit and scope of the present inventive concept as defined in the appended claims.

What is claimed is:

1. An image sensor comprising:
- a semiconductor substrate including a first pixel group and a second pixel group, each of which includes at least four pixel regions, the first and second pixel groups sharing a first pixel region of the pixel regions;
- a pixel isolation structure disposed in the semiconductor substrate and surrounding each of the pixel regions;
- a first device isolation pattern provided in the second pixel group and disposed on a first portion of the pixel isolation structure;
- a floating diffusion region disposed adjacent to the first device isolation pattern in each of the pixel regions;
- a ground dopant region provided in the first pixel group and disposed on a second portion of the pixel isolation structure; and
- a second device isolation pattern provided in the first pixel group and disposed between the second portion of the pixel isolation structure and the ground dopant region.

2. The image sensor of claim 1, wherein the pixel isolation structure comprises:
- a semiconductor pattern vertically penetrating the semiconductor substrate;
- a liner insulating pattern disposed between the semiconductor pattern and the semiconductor substrate; and
- a barrier dopant region adjacent to the liner insulating pattern in the semiconductor substrate,
- wherein the barrier dopant region is vertically spaced apart from the ground dopant region with the second device isolation pattern interposed therebetween.

3. The image sensor of claim 2, further comprising:
- a bias contact plug penetrating a portion of the pixel isolation structure so as to be connected to the semiconductor pattern.

4. The image sensor of claim 1, wherein the pixel isolation structure comprises:
- first and second isolation portions parallel to a first direction; and
- third and fourth isolation portions intersecting the first and second isolation portions and being parallel to a second direction,
- wherein the first device isolation pattern is provided between the first and third isolation portions of the pixel isolation structure when viewed in a plan view, and
- wherein the ground dopant region is provided between the second and fourth isolation portions of the pixel isolation structure when viewed in the plan view.

5. The image sensor of claim 4, wherein vertical lengths of the first and second portions of the pixel isolation structure are smaller than vertical lengths of the first to fourth isolation portions of the pixel isolation structure.

6. The image sensor of claim 4, wherein the first device isolation pattern comprises:
- a first portion parallel to the first direction; and
- a second portion intersecting the first portion and being parallel to the second direction, and
- wherein the first portion of the first device isolation pattern is shorter than the first isolation portion of the pixel isolation structure, and the second portion of the first device isolation pattern is shorter than the third isolation portion of the pixel isolation structure.

7. The image sensor of claim 1, wherein a width of each of the first and second device isolation patterns in one direction is greater than a width of the pixel isolation structure in the one direction.

8. The image sensor of claim 1, further comprising:
- a photoelectric conversion region provided in each of the pixel regions;
- a transfer gate electrode provided between the photoelectric conversion region and the floating diffusion region in each of the pixel regions;
- a semiconductor layer disposed on an insulating layer covering the transfer gate electrode; and
- pixel transistors disposed on the semiconductor layer.

9. The image sensor of claim 8, further comprising:
- a through-insulating pattern penetrating the semiconductor layer;
- a first through-plug penetrating a first portion of the through-insulating pattern so as to be connected to the floating diffusion region; and
- a second through-plug penetrating a second portion of the through-insulating pattern so as to be connected to the ground dopant region.

10. The image sensor of claim 8, further comprising:
- first bonding pads connected to the floating diffusion region and the ground dopant region; and
- second bonding pads connected to the pixel transistors and bonded to the first bonding pads.

11. The image sensor of claim 8, further comprising:
- first bonding pads connected to the pixel transistors; and
- a logic circuit layer comprising:

logic circuits provided on a second semiconductor substrate; and second bonding pads connected to the logic circuits and bonded to the first bonding pads.

12. The image sensor of claim 8, further comprising:

a logic circuit layer comprising: logic circuits provided on a second semiconductor substrate and connected to the pixel transistors; and logic through-plugs penetrating the semiconductor layer to connect the logic circuits and the pixel transistors to each other.

13. An image sensor comprising:

a semiconductor substrate having a first conductivity type and having a first surface and a second surface opposite to the first surface;

a pixel isolation structure disposed in the semiconductor substrate to define first, second and third pixel regions, the pixel isolation structure comprising:

a first pixel isolation structure between the first and second pixel regions; and a second pixel isolation structure between the second and third pixel regions;

a first device isolation pattern which is adjacent to the first surface of the semiconductor substrate and is disposed on the first pixel isolation structure;

a second device isolation pattern which is spaced apart from the first surface of the semiconductor substrate and is disposed on the second pixel isolation structure;

a floating diffusion region having a second conductivity type and disposed adjacent to the first device isolation pattern in each of the first, second and third pixel regions; and a ground dopant region having the first conductivity type and disposed in the semiconductor substrate on the second device isolation pattern.

14. The image sensor of claim 13, wherein the second device isolation pattern is disposed between the ground dopant region and the second pixel isolation structure in a vertical view.

15. The image sensor of claim 13, further comprising:

a barrier dopant region having the first conductivity type and disposed in the semiconductor substrate to cover a side surface of the pixel isolation structure, wherein the barrier dopant region is spaced apart from the ground dopant region with the second device isolation pattern interposed therebetween.

16. The image sensor of claim 13, further comprising:

a photoelectric conversion region provided in each of the first, second and third pixel regions;

a transfer gate electrode disposed on the first surface of the semiconductor substrate between the photoelectric conversion region and the floating diffusion region in each of the first, second and third pixel regions;

an insulating layer covering the transfer gate electrodes of the first, second and third pixel regions on the semiconductor substrate;

a semiconductor layer disposed on the insulating layer; and pixel transistors provided on the semiconductor layer and connected to the floating diffusion regions.

17. The image sensor of claim 13, further comprising:

color filters disposed on the second surface of the semiconductor substrate to correspond to the first, second and third pixel regions, respectively; and micro lenses on the color filters.

18. An image sensor comprising:

a photoelectric conversion circuit layer comprising photoelectric conversion elements provided in a first semiconductor layer having a first conductivity type;

a pixel circuit layer comprising pixel transistors provided on a second semiconductor layer and connected to the photoelectric conversion elements; and a logic circuit layer comprising logic circuits provided on a third semiconductor layer and connected to the pixel transistors, wherein the pixel circuit layer is disposed between the photoelectric conversion circuit layer and the logic circuit layer in a vertical view, wherein the photoelectric conversion circuit layer comprises:

a pixel isolation structure disposed in the first semiconductor layer to define first, second and third pixel regions, the pixel isolation structure comprising:

a first pixel isolation structure between the first and second pixel regions; and a second pixel isolation structure between the second and third pixel regions;

a first device isolation pattern which is adjacent to a first surface of the first semiconductor layer and is disposed on the first pixel isolation structure;

a second device isolation pattern which is spaced apart from the first surface of the first semiconductor layer and is disposed on the second pixel isolation structure;

a floating diffusion region having a second conductivity type and disposed adjacent to the first device isolation pattern in each of the first, second and third pixel regions; and a ground dopant region having the first conductivity type and disposed in the first semiconductor layer on the second device isolation pattern.

19. The image sensor of claim 18, further comprising:

a barrier dopant region having the first conductivity type and disposed in the first semiconductor layer to cover a side surface of the pixel isolation structure, wherein the barrier dopant region is vertically spaced apart from the ground dopant region with the second device isolation pattern interposed therebetween.

20. The image sensor of claim 18, wherein the ground dopant region overlaps a portion of the second pixel isolation structure when viewed in a plan view.

* * * * *